US012411155B2

(12) United States Patent
Sato

(10) Patent No.: US 12,411,155 B2
(45) Date of Patent: Sep. 9, 2025

(54) PLUNGER AND CONTACT PROBE

(71) Applicant: YOKOWO CO., LTD., Tokyo (JP)

(72) Inventor: Kenichi Sato, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 144 days.

(21) Appl. No.: 17/421,731

(22) PCT Filed: Jan. 23, 2020

(86) PCT No.: PCT/JP2020/002356
§ 371 (c)(1),
(2) Date: Jul. 9, 2021

(87) PCT Pub. No.: WO2020/158575
PCT Pub. Date: Aug. 6, 2020

(65) Prior Publication Data
US 2022/0082588 A1 Mar. 17, 2022

(30) Foreign Application Priority Data

Jan. 29, 2019 (JP) ................................. 2019-012725

(51) Int. Cl.
G01R 1/067 (2006.01)

(52) U.S. Cl.
CPC ..... G01R 1/06761 (2013.01); G01R 1/06722 (2013.01)

(58) Field of Classification Search
CPC ................. G01R 1/06761; G01R 1/06722
See application file for complete search history.

(56) References Cited

U.S. PATENT DOCUMENTS

| 6,414,500 | B1 * | 7/2002 | Mizuta | G01R 1/0466 324/756.04 |
| 7,023,231 | B2 † | 4/2006 | Howland, Jr. | |
| 7,667,471 | B2 † | 2/2010 | Kurotori | |
| 8,183,877 | B2 † | 5/2012 | Tanaka | |
| 10,168,357 | B2 * | 1/2019 | Yin | C25D 5/50 |
| 2003/0214045 | A1 * | 11/2003 | Lahiri | H01L 21/4853 257/761 |
| 2004/0239355 | A1 | 12/2004 | Kazama | |

(Continued)

FOREIGN PATENT DOCUMENTS

| JP | 2004-340867 A | 12/2004 |
| JP | 2009-282003 A | 12/2009 |

(Continued)

OTHER PUBLICATIONS

Translation of JP 2011214965 A (Year: 2011).*

(Continued)

Primary Examiner — Paresh Patel
(74) Attorney, Agent, or Firm — XSENSUS LLP

(57) ABSTRACT

A plunger includes a conductive base layer, and a platinum group layer which is provided on the outside of the base layer and which contains a platinum group element as a main component. The plunger has the base layer as its base material, and has the platinum group layer on the outside of the base layer at the tip part to come into contact with an inspection object. A contact probe includes the plunger, and a spring which abuts on the plunger at an end part.

16 Claims, 32 Drawing Sheets

(56) References Cited

U.S. PATENT DOCUMENTS

| | | | |
|---|---|---|---|
| 2004/0239356 A1* | 12/2004 | Kazama | H01R 13/2421 324/754.14 |
| 2006/0197542 A1 | 9/2006 | Tanaka | |
| 2007/0200582 A1* | 8/2007 | Ishizuka | G01R 1/06738 324/754.03 |
| 2008/0143366 A1* | 6/2008 | Kurotori | G01R 1/06761 324/755.11 |
| 2009/0243640 A1* | 10/2009 | Katsuma | G01R 1/06722 324/762.01 |
| 2010/0244869 A1* | 9/2010 | Uchida | G01R 1/06722 324/755.01 |
| 2013/0099811 A1 | 4/2013 | Lee | |
| 2013/0115722 A1 | 5/2013 | Nakagawa et al. | |
| 2017/0307657 A1* | 10/2017 | Crippa | G01R 1/06716 |
| 2018/0076590 A1* | 3/2018 | Oda | H01R 12/57 |
| 2018/0340976 A1* | 11/2018 | Ishii | G01R 1/06722 |

FOREIGN PATENT DOCUMENTS

| | | | | |
|---|---|---|---|---|
| JP | 2011-95254 A | | 5/2011 | |
| JP | 2011214965 A | * | 10/2011 | |
| JP | 2012-198024 A | | 10/2012 | |
| JP | 2013-101043 A | | 5/2013 | |
| JP | 2013-529789 A | | 7/2013 | |
| JP | 2013196924 A | * | 9/2013 | |
| JP | 2014081231 A | * | 5/2014 | G01R 1/06738 |
| JP | 2015-089955 A | | 5/2015 | |
| JP | 2015-215223 A | | 12/2015 | |
| JP | 2018-501490 A | | 1/2018 | |
| KR | 2004-0013010 A | | 2/2004 | |
| KR | 2006-0096250 A | | 9/2006 | |
| TW | 200405012 A | | 4/2004 | |
| WO | 2013/084730 A1 | | 6/2013 | |

OTHER PUBLICATIONS

Translation of JP 2013196924 A (Year: 2013).*
Translation of JP-2014081231-A (Year: 2014).*
Japanese Office Action issued Jan. 17, 2023 in corresponding Japanese Patent Application No. 2020-569566 (with English translation), 6 pages.
Korean Office Action issued Jan. 17, 2023 in corresponding Korean Patent Application No. 10-2021-7021462 (with English translation), 10 pages.
International Search Report and Written Opinion mailed on Mar. 24, 2020, received for PCT Application PCT/JP2020/002356, Filed on Jan. 23, 2020, 8 pages including English Translation.

* cited by examiner
† cited by third party

FIG. 2

FIRST TEST: TEST OBJECTS

| SAMPLE | PLUNGER BASE MATERIAL | SURFACE TREATMENT ON TIP PART |
|---|---|---|
| SAMPLE A | Pd ALLOY | Au COATING (COATING THICKNESS OF 1.0 μm) |
| SAMPLE B | | Au BASE COATING + Ir COATING (COATING THICKNESS OF 0.5 μm) |
| SAMPLE C | | Au BASE COATING + Ru COATING (COATING THICKNESS OF 1.0 μm) |

FIG. 3

FIRST TEST: TEST CONDITIONS

| CONDUCTION CONDITION α | IMPRESSED CURRENT OF 15 A, IMPRESSING TIME OF 20 ms, 12,500 TIMES OF CONDUCTION |
|---|---|
| CONDUCTION CONDITION β | IMPRESSED CURRENT OF 15 A, IMPRESSING TIME OF 20 ms, 25,000 TIMES OF CONDUCTION |

| INSPECTION OBJECT | PPF LEADFRAME (Cu + Ni + Pd + Au) |
|---|---|

FIG. 4
FIRST TEST: OBSERVATION
|  | INITIAL STATE | CONDUCTION CONDITION α (12,500 TIMES OF CONDUCTION) | CONDUCTION CONDITION β (25,000 TIMES OF CONDUCTION) |
|---|---|---|---|
| SAMPLE A (Au COATING) | (1) 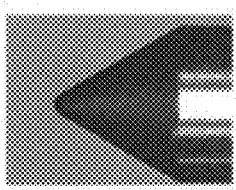 | (2) 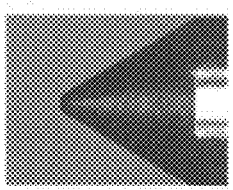 | (3) 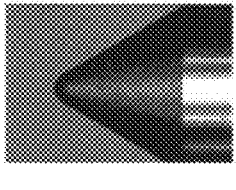 |
| SAMPLE B (Ir COATING) | (4) | (5) | (6) |
| SAMPLE C (Ru COATING) | (7) | (8) | (9) |
FIG. 5
FIRST TEST: WEAR AMOUNT
| SAMPLE | WEAR AMOUNT (= L - L') |
|---|---|
| SAMPLE A (Au COATING, 1 μm) | 6 μm |
| SAMPLE B (Ir COATING, 0.5 μm) | 0 μm |
| SAMPLE C (Ru COATING, 1.0 μm) | 0 μm |

FIRST TEST: OBSERVATION

SAMPLE B (Ir COATING),
CONDUCTION CONDITION β (25,000 TIMES OF CONDUCTION)

FIRST TEST: OBSERVATION

SAMPLE B (Ir COATING),
CONDUCTION CONDITION β (25,000 TIMES OF CONDUCTION)

FIRST TEST: OBSERVATION

SAMPLE C (Ru COATING),
CONDUCTION CONDITION β (25,000 TIMES OF CONDUCTION)

FIRST TEST: OBSERVATION

SAMPLE C (Ru COATING),
CONDUCTION CONDITION β (25,000 TIMES OF CONDUCTION)

FIRST TEST: SEM-EDX COMPONENT ANALYSIS

FIRST TEST: SEM-EDX COMPONENT ANALYSIS

FIRST TEST: SEM-EDX COMPONENT ANALYSIS

FIRST TEST: SEM-EDX COMPONENT ANALYSIS

PALLADIUM Pd

FIRST TEST: SEM-EDX COMPONENT ANALYSIS

SILVER Ag

FIRST TEST: SEM-EDX COMPONENT ANALYSIS

GOLD Au

FIG. 13

SECOND TEST: TEST OBJECTS

| SAMPLE | PLUNGER BASE MATERIAL | SURFACE TREATMENT ON TIP PART |
|---|---|---|
| SAMPLE D | Pd ALLOY | WITHOUT ANY COATING |
| SAMPLE E (= SAMPLE B) | | Au BASE COATING + Ir COATING (COATING THICKNESS OF 0.5 μm) |
| SAMPLE F (= SAMPLE C) | | Au BASE COATING + Ru COATING (COATING THICKNESS OF 0.5 μm) |

FIG. 14

SECOND TEST: TEST CONDITIONS

| CONDUCTION CONDITION γ | IMPRESSED CURRENT OF 2 A |
|---|---|
| CONDUCTION CONDITION δ | IMPRESSED CURRENT OF 5 A |
| CONDUCTION CONDITION ε | IMPRESSED CURRENT OF 15 A |

| INSPECTION OBJECT | Au ALLOY (Au IS MAIN COMPONENT) |
|---|---|

SECOND TEST: MELTING SIZE

| SAMPLE | MELTING SIZE | |
|---|---|---|
| | CONDUCTION CONDITION γ (2 A) | CONDUCTION CONDITION δ (5 A) |
| SAMPLE D (WITHOUT COATING) | 100 μm | 110 μm |
| SAMPLE E (Ir COATING) | 15 μm | 23 μm |
| SAMPLE F (Ru COATING) | 12 μm | 18 μm |

SECOND TEST: EDX COMPONENT ANALYSIS

SECOND TEST: EDX COMPONENT ANALYSIS

SAMPLE F (Ru COATING), CONDUCTION CONDITION γ (2 A)

SECOND TEST: EDX COMPONENT ANALYSIS

SAMPLE F (Ru COATING), CONDUCTION CONDITION δ (5 A)

SECOND TEST: EDX COMPONENT ANALYSIS

SAMPLE F (Ru COATING), CONDUCTION CONDITION ε (15 A)

THIRD TEST: INSPECTION OBJECTS

| SAMPLE | PLUNGER BASE MATERIAL | SURFACE TREATMENT ON TIP PART |
|---|---|---|
| SAMPLE G | Pd ALLOY | WITHOUT ANY COATING |
| SAMPLE H (= SAMPLE B) | | Au BASE COATING + Ir COATING (COATING THICKNESS OF 0.5 μm) |
| SAMPLE I (= SAMPLE C) | | Au BASE COATING + Ru COATING (COATING THICKNESS OF 1.0 μm) |

FIG. 24

THIRD TEST: TEST CONDITIONS

| CONDUCTION CONDITION η | IMPRESSED CURRENT OF 5 A, IMPRESSING TIME OF 20 ms, 12,500 TIMES OF CONDUCTION |
|---|---|
| CONDUCTION CONDITION θ | IMPRESSED CURRENT OF 8 A, IMPRESSING TIME OF 20 ms, 12,500 TIMES OF CONDUCTION |
| CONDUCTION CONDITION λ | IMPRESSED CURRENT OF 12 A, IMPRESSING TIME OF 20 ms, 12,500 TIMES OF CONDUCTION |

| INSPECTION OBJECT | SOLDER BAR |
|---|---|

FIG. 25

THIRD TEST: CONTACT RESISTANCE VALUE

CONDUCTION CONDITION λ (12 A)

FOURTH TEST: TEST OBJECTS

| SAMPLE | PLUNGER BASE MATERIAL | SURFACE TREATMENT ON TIP PART |
|---|---|---|
| SAMPLE J | Pd ALLOY | Au BASE COATING + Ru COATING (COATING THICKNESS OF 20.8 nm) |
| SAMPLE K | | Au BASE COATING + Ru COATING (COATING THICKNESS OF 185 nm) |

FIG. 29

FOURTH TEST: TEST CONDITION

| CONDUCTION CONDITION μ (= CONDUCTION CONDITION β) | IMPRESSED CURRENT OF 15 A, IMPRESSING TIME OF 20 ms, 25,000 TIMES OF CONDUCTION |
|---|---|

| INSPECTION OBJECT | PPF LEADFRAME (Cu + Ni + Pd + Au) |
|---|---|

FIG. 30

| FOURTH TEST: OBSERVATION | INITIAL STATE | CONDUCTION CONDITION μ (25k) |
|---|---|---|
| SAMPLE J (20.8nm) | (1) | (2) |
| SAMPLE K (185nm) | (3) | (4) |

FIFTH TEST: TEST OBJECT

| SAMPLE | PLUNGER BASE MATERIAL | SURFACE TREATMENT ON TIP PART |
|---|---|---|
| SAMPLE L | BeCu ALLOY | Pb BASE COATING + Ru COATING (COATING THICKNESS OF 1.0 μm) |

FIFTH TEST: TEST OBJECT

| CONDUCTION CONDITION u | IMPRESSED CURRENT OF 15 A, IMPRESSING TIME OF 20 ms, 25,000 TIMES OF CONDUCTION |
|---|---|
| INSPECTION OBJECT | PPF LEADFRAME (Cu + Ni + Pd + Au) |

FIFTH TEST: OBSERVATION

INITIAL STATE

FIFTH TEST: OBSERVATION

INITIAL STATE

FIFTH TEST: OBSERVATION

CONDUCTION CONDITION u (25,000 TIMES OF CONDUCTION)

FIFTH TEST: OBSERVATION

CONDUCTION CONDITION u (25,000 TIMES OF CONDUCTION)

FIFTH TEST: OBSERVATION

FIFTH TEST: EDX COMPONENT ANALYSIS

SEM

FIFTH TEST: EDX COMPONENT ANALYSIS

GOLD Au

FIFTH TEST: EDX COMPONENT ANALYSIS

PALLADIUM Pd

FIFTH TEST: EDX COMPONENT ANALYSIS

RUTHENIUM Ru

FIFTH TEST: EDX COMPONENT ANALYSIS

NICKEL Ni

FIFTH TEST: EDX COMPONENT ANALYSIS

COPPER Cu

FIFTH TEST: EDX COMPONENT ANALYSIS

FIG. 39

FIFTH TEST: CONTACT RESISTANCE VALUE

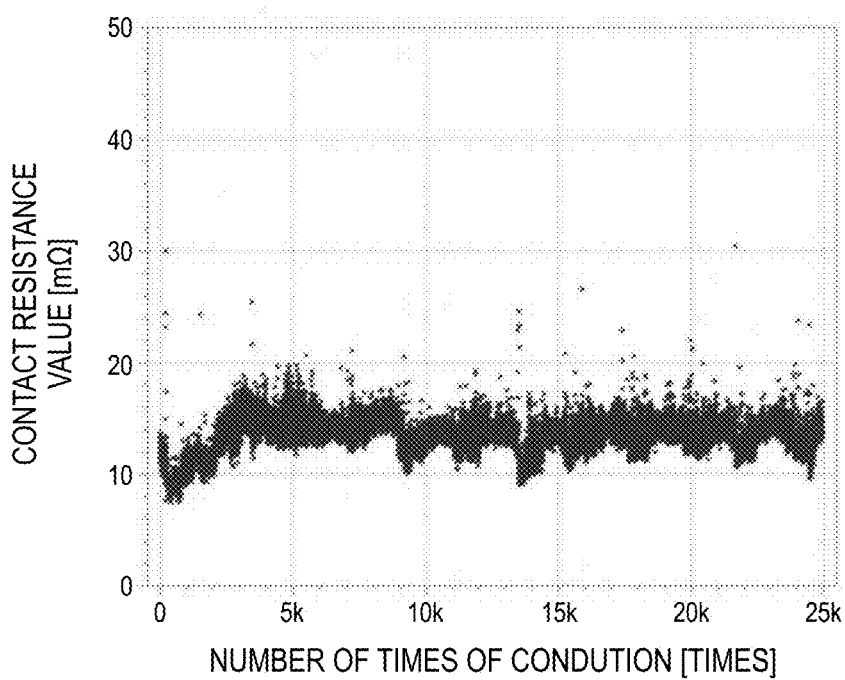

FIG. 40

SIXTH TEST: TEST OBJECTS

| SAMPLE | PLUNGER BASE MATERIAL | SURFACE TREATMENT ON TIP PART |
|---|---|---|
| SAMPLE P (FOR COMPARISON) | Pd ALLOY | WITHOUT ANY COATING |
| SAMPLE Q | | DLC COATING |
| SAMPLE R | | Rh COATING (COATING THICKNESS OF 1.0 μm) |
| SAMPLE S | | Ru COATING (COATING THICKNESS OF 1.0 μm) |
| SAMPLE T | | Au COATING (COATING THICKNESS OF 1.0 μm) |
| SAMPLE U | BeCu ALLOY | Ni, Pd, and Ru COATINGS (TOTAL COATING THICKNESS OF 1.0 μm) |

FIG. 41
SIXTH TEST: TEST CONDITION
| CONDUCTION CONDITION ξ | IMPRESSED CURRENT OF 1 A, IMPRESSING TIME OF 72 h, ATMOSPHERIC TEMPERATURE OF 120°C |
|---|---|
| INSPECTION OBJECT | SOLDER MATERIAL (SOLDER BLOCK) |
|---|---|
FIG. 42A
SAMPLE P (FOR COMPARISON)
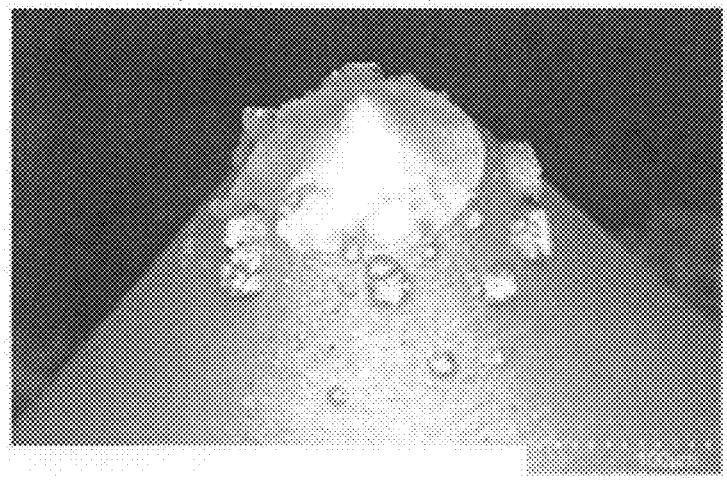
FIG. 42B
SAMPLE Q
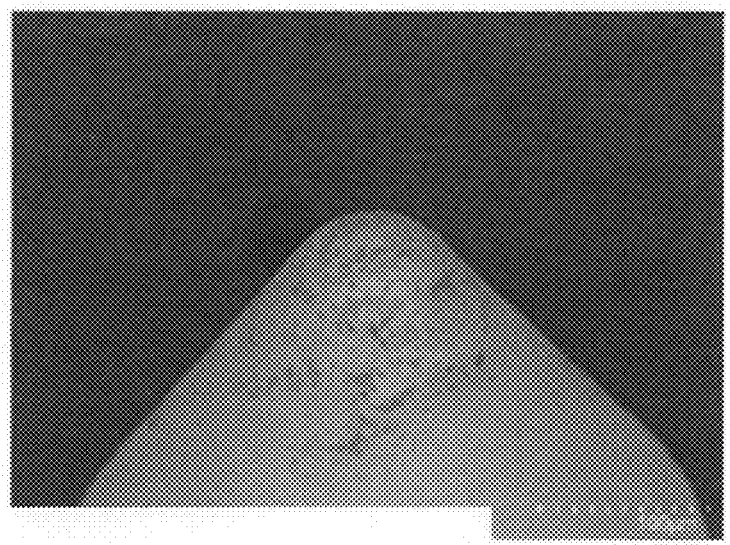

PLUNGER AND CONTACT PROBE

CROSS-REFERENCE TO RELATED APPLICATIONS

The present application is based on PCT filing PCT/JP2020/002356, filed Jan. 23, 2020, which claims priority to JP 2019-012725, filed Jan. 29, 2019, the entire contents of each are incorporated herein by reference.

TECHNICAL FIELD

The present invention relates to a plunger and a contact probe having the plunger.

BACKGROUND ART

In electrical characteristic inspections on electronic components such as integrated circuits and large-scale integrated circuits using semiconductor elements, contact probes are used to electrically connect an inspection object and a board for inspection. Contact probes have plungers movable along their longitudinal directions, and the tip parts of the plungers are brought into elastic contact with the electrodes of an electronic component which is an inspection object to perform a conduction inspection (see Patent Literature 1 for instance).

CITATION LIST

Patent Literature

[Patent Literature 1] Japanese Patent Publication No. 2015-215223

SUMMARY OF INVENTION

Technical Problem

In conduction inspections, the problem of abrasion and wear of the tip parts of plungers which are brought into contact with inspection objects occurs. If the tip part of a plunger abrades or wears, the contact resistance value between the tip part of the plunger and the inspection object becomes unstable, and it becomes difficult to accurately carry out the conduction test. In recent years, this problem has become more pronounced as the amounts of inspection current increase with increases in the amounts of current required for semiconductor components.

An object of the present invention is to suppress an occurrence of abrasion and wear during a conduction inspection.

Solution to Problem

One aspect of the present invention is a plunger including a conductive base layer and a platinum group layer which is provided on an outside of the base layer and contains a platinum group element as a main component.

Another aspect of the present invention is a contact probe including the above-mentioned plunger and a spring which abuts on the above-mentioned plunger at an end part.

Advantageous Effects of Invention

According to these aspects, it is possible to implement a plunger including a platinum group layer provided on the outside of a conductive base layer and containing a platinum group element as a main component. Platinum group elements such as ruthenium (Ru), iridium (Ir), rhodium (Rh), and osmium (Os) have relatively high melting points higher than about 2000° C., and are unlikely to be melted by conduction. For this reason, it is possible to suppress the occurrence of abrasion and wear during a conduction inspection. Further, it is possible to implement a plunger in which a solder component is hardly adhered to the tip part and the abrasion and the wear are also hardly occurred in conduction inspection which is carried out in a state where the tip of the plunger is in contact with the solder material.

BRIEF DESCRIPTION OF DRAWINGS

FIG. 2 is a view illustrating compositions of samples which are test objects of a first test.

FIG. 3 is a view illustrating test conditions of the first test.

FIG. 4 shows enlarged photographs of the samples of the first test.

FIG. 5 is a view illustrating measurement results of the wear amounts of the samples of the first test.

FIG. 13 is a view illustrating compositions of samples which are test objects of a second test.

FIG. 14 is a view illustrating test conditions of the second test.

FIG. 24 is a view illustrating test conditions of the third test.

FIG. 25 shows enlarged photographs of the samples of the third test.

FIG. 29 is a view illustrating a test condition of the fourth test.

FIG. 30 shows enlarged photographs of the samples of the fourth test.

FIG. 39 is a view illustrating contact resistance value measurement results of the fifth test.

FIG. 40 is a view illustrating compositions of samples which are test objects of a sixth test.

FIG. 41 is a view illustrating a test condition of the sixth test.

FIG. 42A shows an electron micrograph of a sample P of the sixth test.

FIG. 42B shows an electron micrograph of a sample Q of the sixth test.

DESCRIPTION OF EMBODIMENTS

An example of an embodiment will be described. However, the present invention is not limited by the embodiment to be described below, and forms which the present invention can be applied to are not limited to the following embodiment.

[Configuration]

Figure 1:
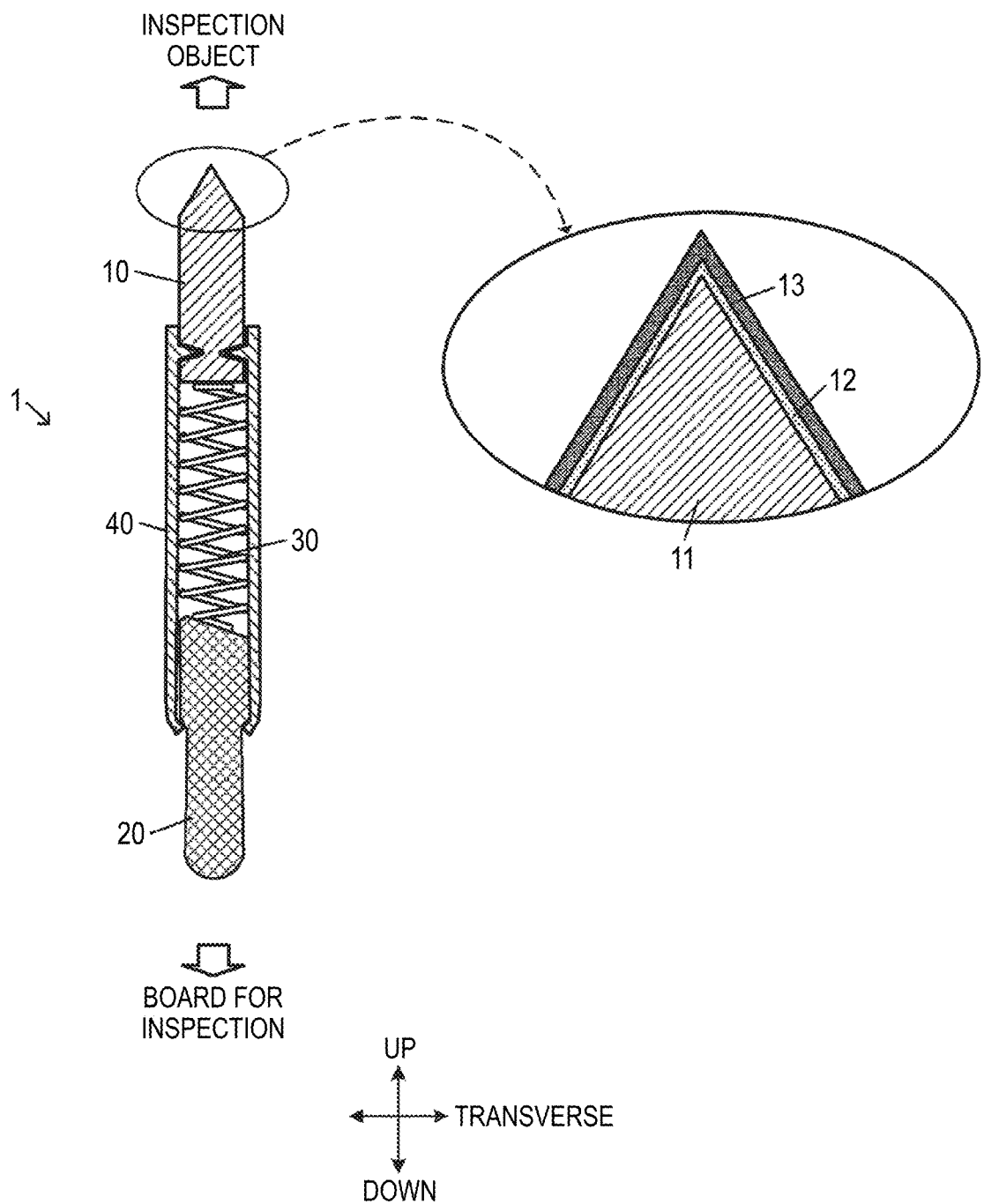
FIG. 1 is a schematic view illustrating a contact probe.

FIG. 1 is a schematic view illustrating a configuration of a contact probe 1 of the present embodiment, and shows a schematic cross-sectional view along the longitudinal direction. According to FIG. 1, the contact probe 1 includes a first plunger 10, a second plunger 20, a spring 30, and a barrel 40. The first plunger 10 is a plunger to come into contact with inspection objects, and the second plunger 20 is a plunger to come into contact with boards for inspection. The spring 30 biases the first plunger 10 and the second plunger 20 in directions away from each other. The barrel 40 holds the spring 30, the root of the first plunger 10, and the root of the second plunger 20 inside to support them as one body.

Herein, the directions of the contact probe 1 are defined as follow. The longitudinal direction of the contact probe 1 (the upward and downward direction in FIG. 1) will be referred to as the upward and downward direction. In the upward and downward direction, the first plunger (10) side (the direction from the second plunger 20 toward the first plunger 10) will be referred to as the upper side, and the second plunger (20) side (the direction from the first plunger 10 toward the second plunger 20) will be referred to as the lower side. Further, a direction parallel to a plane perpendicular to the upward and downward direction will be referred to as the traverse direction.

The first plunger 10 is formed of a conductive material. FIG. 1 shows that the shape of the tip part to come into contact with inspection objects is a conical shape; however, it may be any other shape corresponding to inspection objects, such as a pyramid shape, a sphere shape, a flat shape, or a crown shape.

As shown in the partial enlarged view on the right side of FIG. 1, the first plunger 10 includes a covering layer 12 that is formed on the outside of a plunger base material 11, and a platinum group layer 13 that is formed on the outside of the covering layer 12. The plunger base material 11 is formed of, for example, an alloy (palladium alloy) of palladium, silver, gold, and so on, or a conductive material such as beryllium copper. The covering layer 12 contains gold (Au) or palladium (Pd) as a main component, and is a base plating layer which is formed to improve the adhesion with the plunger base material 11 and the platinum group layer 13. The platinum group layer 13 contains a platinum group element as a main component, such as ruthenium (Ru), iridium (Ir), rhodium (Rh), or osmium (Os), and in the present embodiment, it is a surface layer. It is desirable that the thickness of the platinum group layer 13 should be, for example, 0.02 μm or larger, as test results to be described below show. Formation of the covering layer 12 and the platinum group layer 13 can be implemented by surface treatment such as electroplating or hot-dip plating.

In the present embodiment, the covering layer 12 is formed all over the outside of the plunger base material 11. The platinum group layer 13 may be formed all over the outside of the covering layer 12, or may be formed only on the conical part of FIG. 1 which is the tip part to come into contact with inspection objects, or only on the further projecting part of the conical shape.

The second plunger 20 has the same layered configuration made of the same materials as those of the first plunger 10. The second plunger 20 may be composed of materials different from those of the first plunger 10, or may have a layered configuration different from that of the first plunger 10.

The spring 30 is a coil spring formed of piano wire or stainless steel wire. On the surfaces of coil springs, plating with gold (Au) is often applied on the outsides of nickel (Ni) base coatings in order to improve the adhesion. However, on the surface of the spring 30, plating with gold (Au) is applied without applying base plating with nickel (Ni). This plating with gold (Au) is applied to form a coating thick since base plating with nickel (Ni) is omitted. The spring 30 is held inside the barrel 40 such that its upper end abuts on the rear end (the lower end in FIG. 1) of the first plunger 10 and its lower end abuts on the rear end (the upper end in FIG. 1) of the second plunger 20. The spring 30 biases the first plunger 10 and the second plunger 20 in directions away from each other. Therefore, when the first plunger 10 comes into contact with an inspection object and the second plunger 20 comes into contact with a board for inspection, elastic contact can be made while applying predetermined contact forces to both contacts.

The barrel 40 is formed of a conductive material such as copper or a copper alloy into a hollow cylindrical shape opened upward and downward. The barrel 40 may be formed by electrocasting (electroforming) with containing nickel (Ni) as a main component. The openings of the upper end and lower end of the barrel 40 are formed to have a diameter slightly smaller than the inside diameter of the middle part of the barrel 40, such that the first plunger 10 and the second plunger 20 are prevented from flying out of the barrel 40. The root side of the first plunger 10 (the rear end side, i.e. the lower end in FIG. 1) has a constricted part, and an annular wedge part provided on the inner side of the upper end of the barrel 40 is fitted into constricted part of the first plunger 10. As a result, the first plunger 10 is restricted so as not to be able to protrude with respect to the barrel 40. The second plunger 20 has a step part provided such that the root side (the rear end side, i.e. the upper end side in FIG. 1) is thicker than the tip side. In this way, the second plunger 20 is configured to be able to protrude with respect to the barrel 40, up to a predetermined protrusion limit.

Contact probes 1 are put into a socket formed of, for example, a resin, and are used. The socket has a plurality of through-holes, and the contact probes 1 are inserted into the individual through-holes. Of both surfaces of the socket, from one surface, the tip sides of the first plungers 10 of the individual contact probes 1 protrude, and from the other surface, the tip sides of the second plungers 20 of the individual contact probes 1 protrude. This socket is positioned and placed on a board for inspection such that the tip parts of the second plungers 20 of the individual contact probes 1 come into contact with the electrodes of the board for inspection. In order for the electrodes of electronic components which are inspection objects to come into contact with the tip parts of the first plungers 10 of the individual contact probes 1, the socket is moved toward the inspection objects or the inspection objects are moved toward the socket. As a result, the board for inspection and the inspection objects are electrically connected through the second plungers 20, the barrels 40, and the first plungers 10 of the contact probes 1. Thereafter, electric inspections on the inspection objects can be performed.

[Tests]

On the platinum group layers 13 of the plungers of the present embodiment (first plungers 10 and second plungers 20), various comparison tests for checking on their effects were carried out. Hereinafter, through a description of the results of these tests, the compositions of the platinum group layers 13 and the effects of the plungers of the present embodiment will be described.

In order to evaluate abrasion and wear when the first plunger 10 is in contact with an inspection object, samples of the first plunger 10 were prepared, and six kinds of tests (first to sixth tests) were carried out on the prepared samples. The samples are samples having coating layers on the outsides of plunger base materials made of a palladium alloy and beryllium copper. The coating layers were formed by electroplating. In electroplating, it is possible to adjust the thicknesses of coating layers by adjusting the plating time, i.e. the time of immersion in the plating solution. Coating layers containing platinum group elements as a main component correspond to platinum group layers 13 of the present embodiment. Plunger base materials have a thin cylindrical shape with a total length of 3.5 mm and an outside diameter of 0.58 mm, and have tip parts formed into a rounded conical shape with a tip angle of 60 degrees to come into contact with inspection objects. The length of the conical shape of the tip parts of the plunger base materials is 0.452 mm. Hereinafter, the individual tests will be described.

(A) First Test

In the first test, conduction durability evaluation was carried out. Conduction durability evaluation is to evaluate samples by intermittently repeating switching on and off of conduction between inspection objects and the tip parts of the samples while bringing the tip parts of the samples into contact with the inspection objects. In the first test, three kinds of samples (samples A, B, and C) were prepared, and conduction durability evaluation on them was carried out. The compositions of the test object samples are shown in FIG. 2, and test conditions of the first test are shown in FIG. 3.

As shown in FIG. 2, of the three kinds of samples A, B, and C used in the first test, the sample A is for comparison, and is a sample made by forming a coating layer of gold (Au) on the plunger base material without forming a platinum group layer 13. The thickness of the Au coating layer of the sample A is 1 μm. The sample B is a sample made by applying base plating (strike plating) on the plunger base material with gold and forming a coating layer of iridium (Ir). The sample B has the iridium (Ir) layer as a platinum group layer 13 of the present embodiment. The thickness of the Ir coating layer of the sample B is 0.5 μm. The sample C is a sample made by applying base plating (strike plating) on the plunger base material with gold and forming a coating layer of ruthenium (Ru). The sample C is a sample having the ruthenium (Ru) layer as a platinum group layer 13 of the present embodiment. The thickness of the Ru coating layer of the sample C is 1 μm.

As shown in FIG. 3, in the first test, tests were carried out under two types of conduction conditions (conduction conditions α and β). The conduction condition α is a condition in which conduction with an impressed current of 15 A and an impressing time of 20 ms should be repeatedly performed 12,500 times. The conduction condition β is a condition in which conduction with an impressed current of 15 A and an impressing time of 20 ms should be repeatedly performed 25,000 times. Since the conduction conditions α and β are different in the number of times of conduction but are the same in the impressed current and the impressing time, as the test procedure, a test under the conduction condition α was carried out first, and a test under the conduction condition β was carried out by consecutively and repeatedly performing conduction 12,500 times while keeping the impressed current (15 A) and the impressing time (20 ms). As an inspection object to be brought into contact with the tip parts of the samples, a PPF (Pre Plated Frame) leadframe usable as internal wiring of a semiconductor package was used.

FIG. 4 to FIG. 12F show the results of the first test. FIG. 4 shows enlarged photographs of the tip parts of the samples as seen from the traverse direction. In FIG. 4, nine photographs are denoted by (1) to (9). (1) to (3) are photographs of the sample A (the Au coating). (4) to (6) are photographs of the sample B (the Ir coating). (7) to (9) are photographs of the sample C (the Ru coating). Further, (1), (4), and (7) are photographs of the initial states before the test. (2), (5), and (8) are photographs of the states after the test under the conduction condition α (12,500 times of conduction). (3), (6), and (9) are photographs of the states after the test under the conduction condition β (25,000 times of conduction).

According to FIG. 4, when the states after the tests under the conduction conditions α and β are compared with the initial states, in the sample A, wear is observed at the tip part, but in the sample B (the Ir coating) and the sample C (the Ru coating), remarkable wear is not observed at the tip parts.

Figure 6:
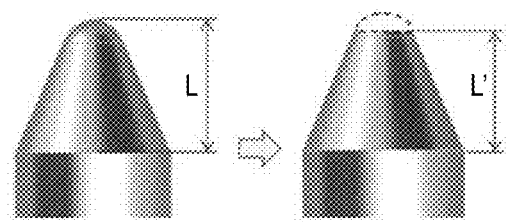
FIG. 6 is a view illustrating an example of the definition of a wear amount.

FIG. 5 shows the measurement results of the wear amounts of the tip parts of the individual samples in the states after the test under the conduction condition β. As shown in FIG. 6, the length L of the conical shape of the tip part of each sample in the initial state, and the length L' of the conical shape of the tip part in the state after the test under the conduction condition β (25,000 times of conduction) were measured, and the difference between both lengths (=L−L') was obtained as the wear amount.

As for the wear amounts of the samples in the states after the test under the conduction condition β, as shown in FIG. 5, the wear amount of the sample A (the Au coating) was 6 μm. In contrast, wear at the sample B (the Ir coating) and the sample C (the Ru coating) could not be found by dimension measurement, so the results deemed such as that the wear amounts are 0 μm or almost 0 μm were obtained. For this reason, regarding the samples B and C, whether wear at the tip parts had actually occurred or not was further checked. In order to observe the appearances of the coating layers formed on the tip parts, electron micrographs of the tip parts were taken.

Figure 7:
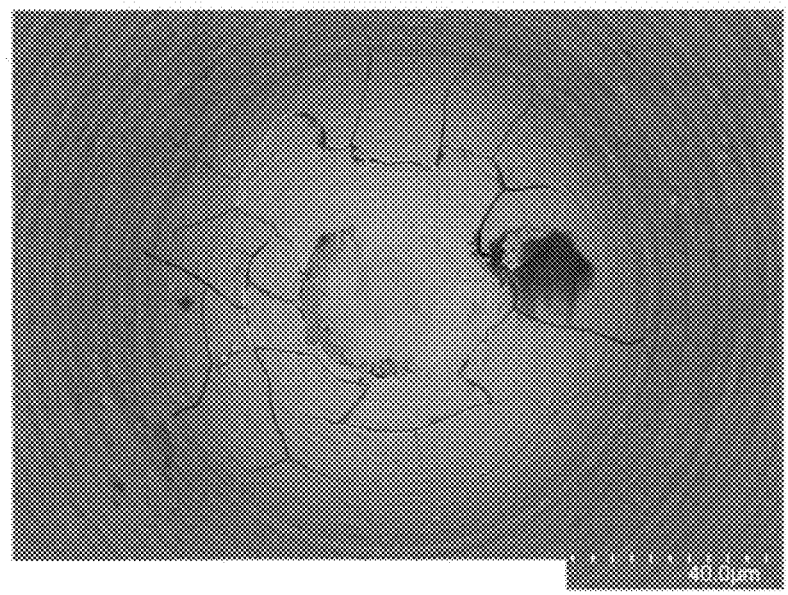
FIG. 7 shows an electron micrograph of a sample of the first test.
Figure 8:
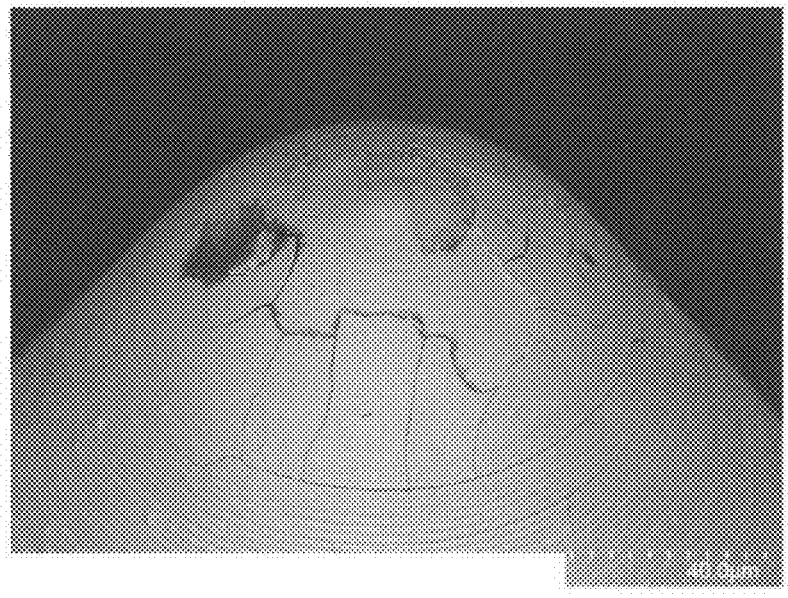
FIG. 8 shows an electron micrograph of the sample of the first test.
Figure 9:
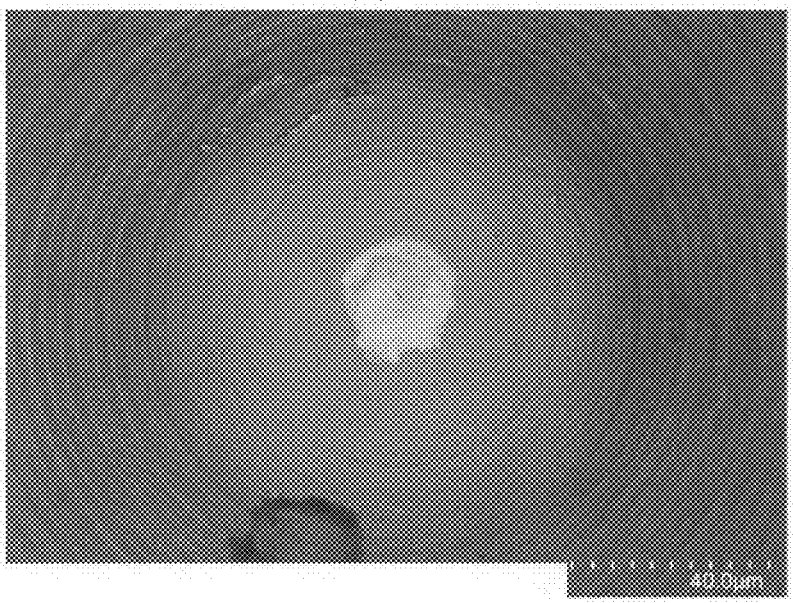
FIG. 9 shows an electron micrograph of the sample of the first test.
Figure 10:
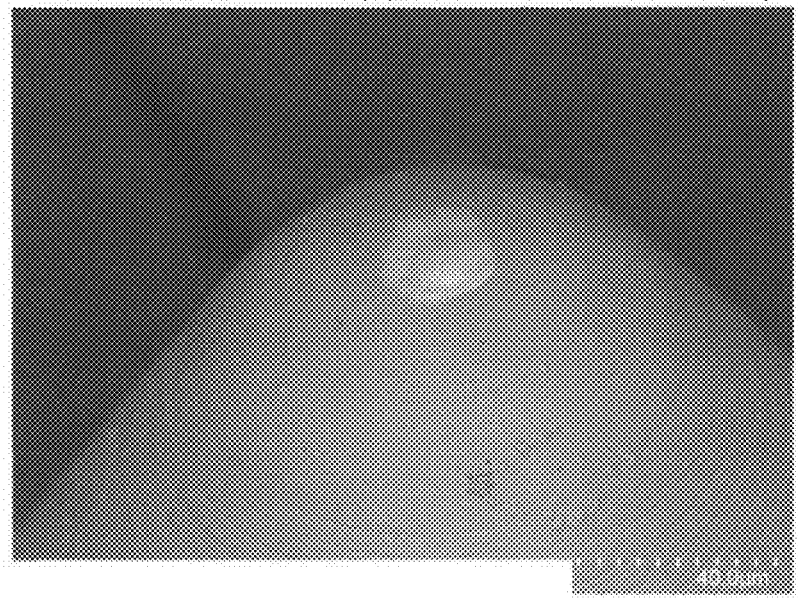
FIG. 10 shows an electron micrograph of the sample of the first test.

FIG. 7 to FIG. 10 show electron micrographs of the tip parts of the samples taken at a magnification of 2000 times. FIG. 7 shows an electron micrograph of the sample B (the Ir coating) in the state after the test under the conduction condition β (25,000 times of conduction) which is a photograph of the upper surface of the tip part taken as viewed from above. FIG. 8 shows an electron micrograph of the sample B (the Ir coating) in the state after the test under the conduction condition β (25,000 times of conduction) which is a photograph of the tip part taken as viewed diagonally from above. FIG. 9 shows an electron micrograph of the sample C (the Ru coating) in the state after the test under the conduction condition β (25,000 times of conduction) which is a photograph of the upper surface of the tip part taken as viewed from above. FIG. 10 shows an electron micrograph of the sample C (the Ru coating) in the state after the test under the conduction condition β (25,000 times of conduction) which is a photograph of the tip part taken as viewed diagonally from above.

According to FIG. 7 and FIG. 8, it can be seen that in the case of the sample B (the Ir coating), cracks occurred in the Ir coating layer of the tip part around the contact part, but the thickness of the Ir coating layer did not decrease. According to FIG. 9 and FIG. 10, it can be seen that in the case of the sample C (the Ru coating), cracks did not occur in the Ru coating layer of the tip part and the thickness of the Ru coating layer did not decrease. It can be seen that there was some adhered substance (the whitish parts in the images of FIG. 9 and FIG. 10) around the contact part. This adhered substance looks like it has the largest thickness at the contact part.

Subsequently, analysis on this adhered substance was carried out. As analysis on the adhered substance, cross-section analysis using a FIB (Focused Ion Beams) was carried out.

Figure 11:
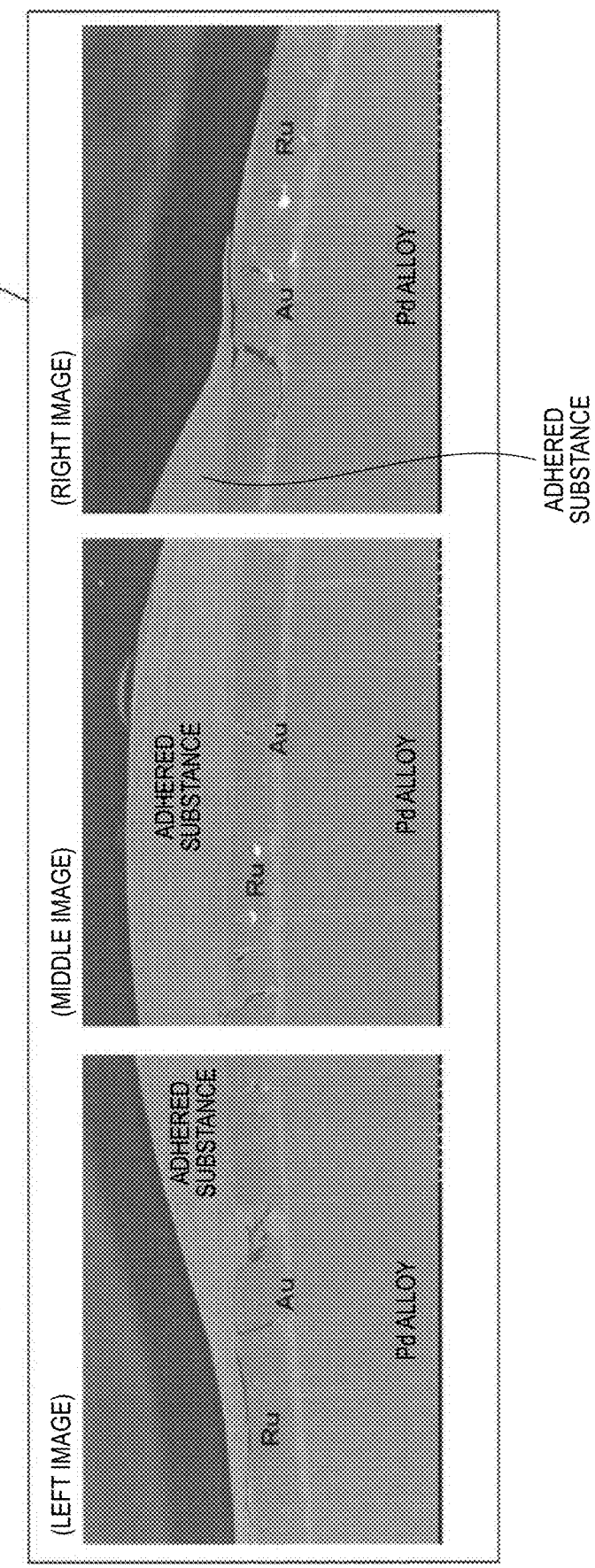
FIG. 11 shows cross-section analysis photographs of the sample of the first test taken by using a FIB.

FIG. 11 shows cross-section photographs of the tip part of the sample C (the Ru coating) which are electron micrographs of cross-sections along the upward and downward direction, including the adhered substance on the surface of Ru coating layer. These cross-section photographs are photographs taken by performing cross-section analysis using the FIB (Focused Ion Beam). Since the cross-section of the tip part was divided into three parts which were imaged, the number of photographs in FIG. 11 is three. The three photographs are shown as a left image, a middle image, and a right image in FIG. 11. The three photograph are arranged side by side with the photograph including the thickest cross-section part of the adhered substance arranged as the middle image.

According to FIG. 11, it can be seen that a plurality of layers consisting of different materials were stacked. It can be presumed that the outermost layer shown as the top layer is the layer corresponding to the adhered substance.

Figure 12A:
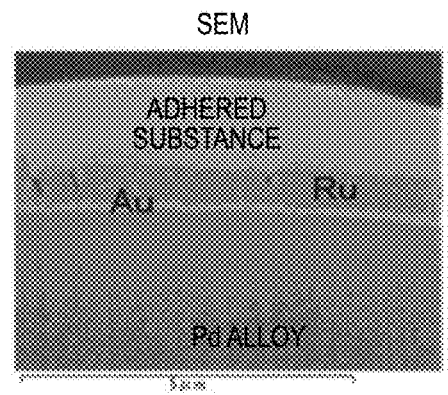
FIG. 12A shows a cross-section image of the sample of the first test taken by using a SEM.
Figure 12B:
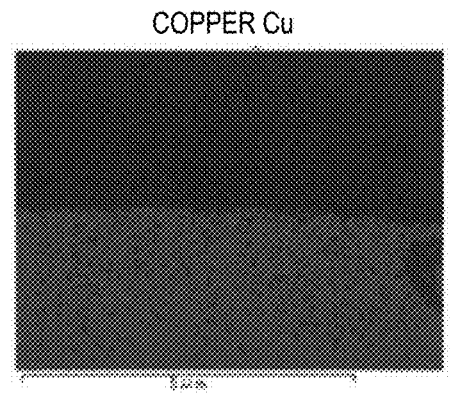
FIG. 12B shows an image of the copper (Cu) component of the sample of the first test taken by EDX.
Figure 12C:
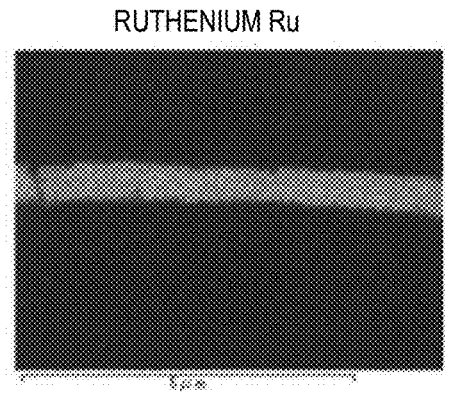
FIG. 12C shows an image of the ruthenium (Ru) component of the sample of the first test taken by EDX.
Figure 12D:
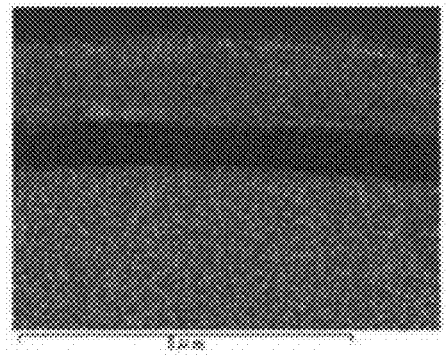
FIG. 12D shows an image of the palladium (Pd) component of the sample of the first test taken by EDX.
Figure 12E:
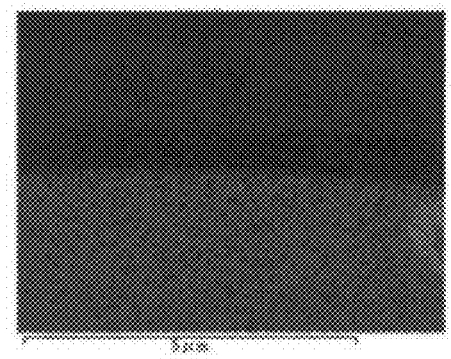
FIG. 12E shows an image of the silver (Ag) component of the sample of the first test taken by EDX.
Figure 12F:
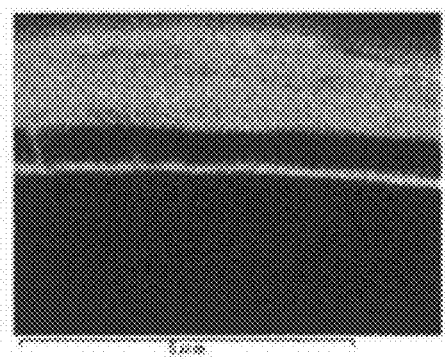
FIG. 12F shows an image of the gold (Au) component of the sample of the first test taken by EDX.

Also, as analysis on the adhered substance, component analysis using EDX (Energy Dispersive X-ray Spectroscopy) was carried out. FIG. 12 B to FIG. 12F show the results of the component analysis on the tip part of the sample C (the Ru coating) which are component images of the cross-section part which corresponds to the middle image of FIG. 11 and where the thickness of the adhered substance is the largest. Theses component images are images taken by performing component analysis using EDX. Six images are shown as FIG. 12A to 12F. FIG. 12A is an image of the cross-section part taken by a scanning electron microscope (SEM). FIG. 12B is a copper (Cu) component image. FIG. 12C is a ruthenium (Ru) component image. FIG. 12D is a palladium (Pd) component image. FIG. 12E is a silver (Ag) component image. FIG. 12F is a gold (Au) component image. In the component images, white or gray parts are parts containing corresponding components, and higher brightness indicates higher component concentration.

According to FIG. 11, and FIG. 12A to FIG. 12F, it can be seen that as the constituent elements of the sample C (the Au coating) in the cross-section photographs of FIG. 11, the plunger base material consisting of a Pd alloy, the Au coating layer which is a base coating layer, and the Ru coating layer which is a platinum group layer 13 were stacked sequentially from the bottom. Further, it can be seen that the adhered substance had been deposited on the Ru coating layer. Although voids (cavities) are observed in the Ru coating layer, remarkable cracks or melting are not observed.

According to FIG. 12A to FIG. 12F, it can be seen that the adhered substance contains gold (Au) as a main component and contains palladium (Pd) and silver (Ag). Although gold (Au) is a component contained in the base coating layer (the Au coating layer), since the part corresponding to the Ru coating layer between the adhered substance and the base coating layer (the Au coating layer) does not contain gold (Au), it is possible to determine that the gold (Au) contained in the adhered substance is not a component exposed from the base coating layer (the Au coating layer). Although the palladium (Pd) and the silver (Ag) are components contained in the plunger base material, since the part corresponding to the base coating layer and the Ru coating layer between the adhered substance and the plunger base material do not contain those components, it is possible to determine that the palladium (Pd) and the silver (Ag) contained in the adhered substance are not components exposed from the plunger base material. Copper (Cu) is contained only in the part of the plunger base material part, and is not contained in the other layers. Ruthenium (Ru) is contained only in the Ru coating layer, and is not contained in the other layers.

For these reasons, it can be considered that the adhered substance is an extraneous substance, not a result of melting of the platinum group layer 13 which is the Ru coating layer. It can be presumed that the components of the PPF leadframe brought as an inspection object into contact with the tip parts of the samples were melted by conduction and were transferred or deposited on the tip parts of the samples.

(B) Second Test

In the second test, spark evaluation was carried out. Spark evaluation is to generate a spark by starting conduction in the state where the tip part of a sample is in contact with an inspection object and separating the tip part of the sample from the inspection object while keeping the conduction state, and evaluate the melting state of the corresponding part. In the second test, three kinds of samples (samples D, E, and F) were prepared, and spark evaluation on the samples was carried out. The compositions of the test object samples are shown in FIG. 13, and test conditions of the second test are shown in FIG. 14.

As shown in FIG. 13, of the three kinds of samples D, E, and F used in the second test, the sample D is for comparison, and is a sample made without forming any coating layer such as a gold (Au) layer or a platinum group layer 13 on the plunger base material. The sample E is a sample made by applying base plating (strike plating) on the plunger base material with gold (Au) and forming a coating layer of iridium (Ir). The thickness of the Ir coating layer of the sample C is 0.5 μm. This sample E has the same composition as that of the sample B used in the first test, and is a sample having the iridium (Ir) layer as a platinum group layer 13 of the present embodiment. The sample F is a sample made by applying base plating (strike plating) on the plunger base material with gold (Au) and forming a coating layer of ruthenium (Ru). The thickness of the Ru coating layer of the sample F is 1 μm. This sample F has the same composition as the sample C used in the first test, and is a sample having the ruthenium (Ru) layer as a platinum group layer 13 of the present embodiment.

As shown in FIG. 14, in the second test, tests were carried out under three types of conduction conditions (conduction conditions γ, δ, and ε). The conduction condition γ is a condition in which the impressed current should be 2 A to generate sparks. The conduction condition δ is a condition in which the impressed current should be 5 A to generate sparks. The conduction condition ε is a condition in which the impressed current should be 15 A to generate sparks. An inspection object to be brought into contact with the tip parts of the samples was made a gold alloy containing gold (Au) as a main component was used.

Figure 15:
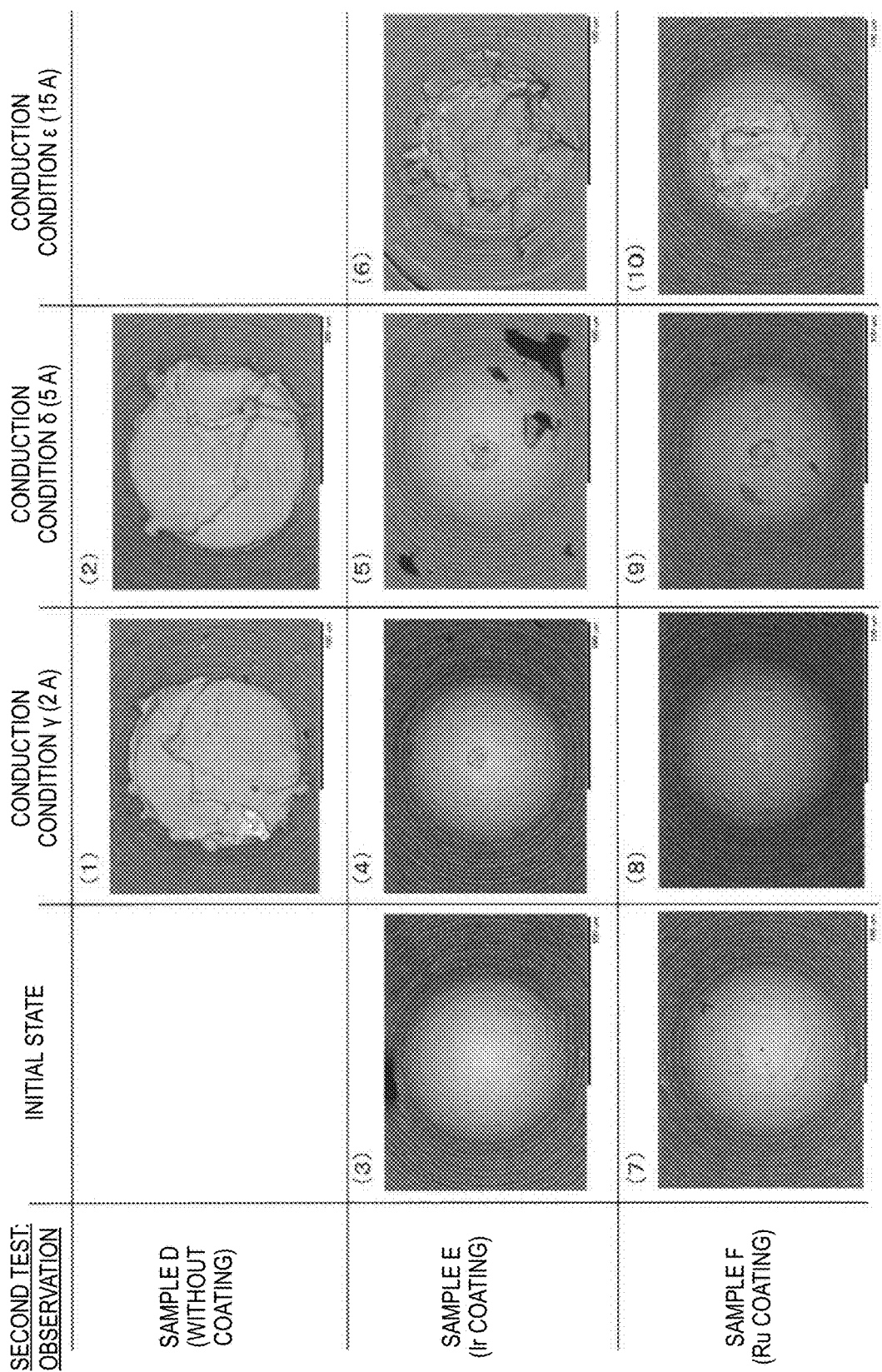
FIG. 15 shows electron micrographs of the samples of the second test.

FIG. 15 to FIG. 22 show the results of the second test. FIG. 15 shows electron micrographs of the tip parts of the samples, all of which are photographs of the upper surfaces of the tip parts taken as viewed from above. FIG. 15 shows ten photographs which are denoted by (1) to (10) in FIG. 15. In FIG. 15, (1) and (2) are photographs of the sample D (without any coating). (3) to (6) are photographs of the sample E (the Ir coating). (7) to (10) are photographs of the sample F (the Ru coating). Further, (3) and (7) are photographs of the initial states before the test. (1), (4), and (8) are photographs of the states after the test under the conduction condition γ (the impressed current of 2 A). (2), (5), and (9) are photographs of the states after the test under the conduction condition δ (the impressed current of 5 A). (6) and (10) are photographs of the states after the test under the conduction condition ε (the impressed current of 15 A). On the sample D, a test under the conduction condition ε (the impressed current of 15 A) was not carried out, since melting was caused over a very wide range by a spark under the conduction condition δ (the impressed current of 5 A).

Figures 16, 17:
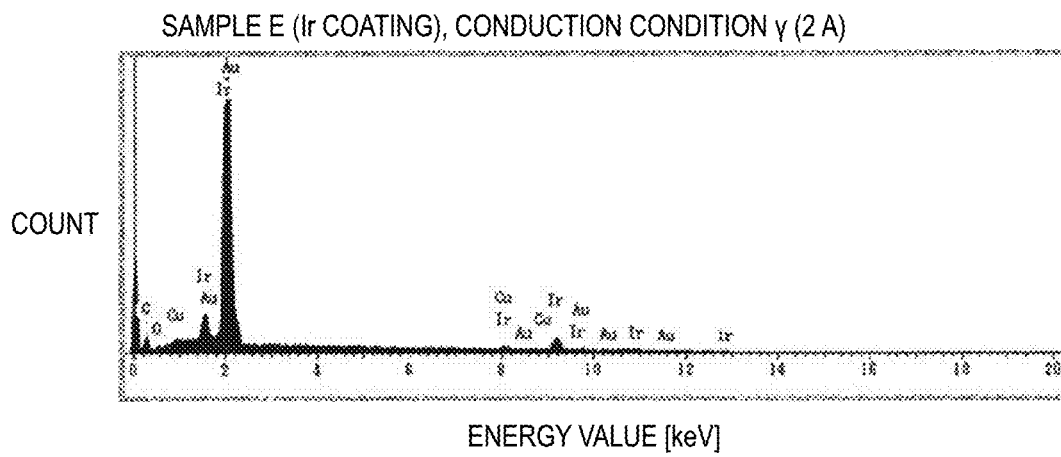
FIG. 16 is a view illustrating the melting sizes of the samples of the second test.
FIG. 17 is a view illustrating a result obtained by performing qualitative analysis on a sample of the second test using EDX.

According to FIG. 15, it can be seen that in every tested sample, melting of the contact parts occurred. With respect to each tested sample, the diameter of the melting mark generated at the contact part was measured as a melting size. FIG. 16 shows the measurement results of the melting sizes of the tip parts of the samples. As shown in FIG. 16, in the states after the test under the conduction condition γ (the impressed current of 2 A), the melting size of the sample D (without any coating) was about 100 μm, and the melting size of the sample E (the Ir coating) was about 15 μm, and the melting size of the sample F (the Ru coating) was about 12 μm. Under the conduction condition δ (the impressed current of 5 A), the melting size of the sample D (without any coating) was about 110 μm, and the melting size of the sample E (the Ir coating) was about 23 μm, and the melting size of the sample F (the Ru coating) was about 18 μm.

When focusing on the states after the tests under the conduction conditions γ and δ, in the sample D (without any coating), melting occurred over a wide range, but in the samples E and F, melting occurred in a small range of less than one-fourth of that of the sample D. Form this, it can be seen that if a platinum group layer 13 which is a Ru coating layer or an Ir coating layer is formed on a tip part, it becomes hard for melting to be caused by sparks. Under the conduction condition ε (the impressed current of 15 A), both of the samples E and F melted over wider ranges as compared to the states after the tests under the conduction conditions γ and δ. It can be seen that in the sample E (the Ir coating), cracks occurred in addition to melting. However, the conduction condition ε is a very strict condition as compared to the conduction conditions γ and δ, and the test on the sample D having no platinum group layer 13 under the corresponding condition was judged to be impossible, so even the test was not carried out. It can be seen from FIG. 15 that the melting ranges of the samples E and F in the states after the test under the conduction condition ε are smaller than those of the sample D after the tests under the conduction conditions γ and δ. The effect depending on whether there is a platinum group layer 13 is remarkable.

Figure 18:
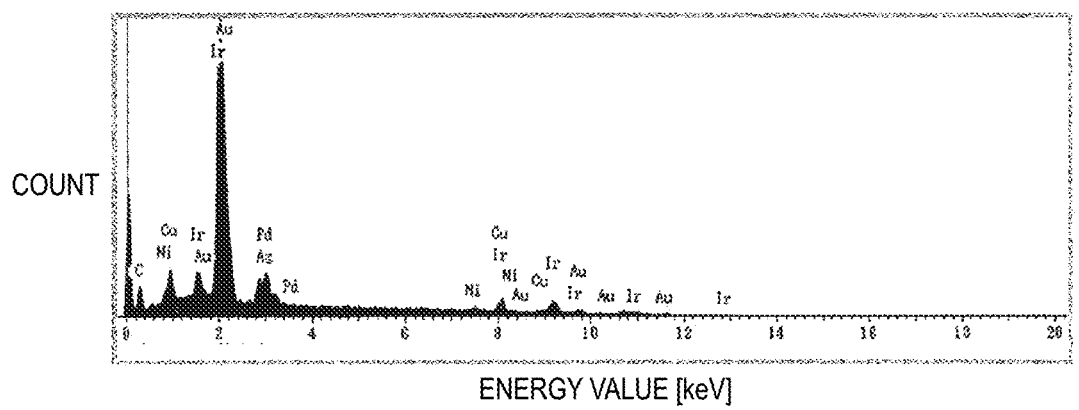
FIG. 18 is a view illustrating a result obtained by performing qualitative analysis on a sample of the second test using EDX.
Figure 19:
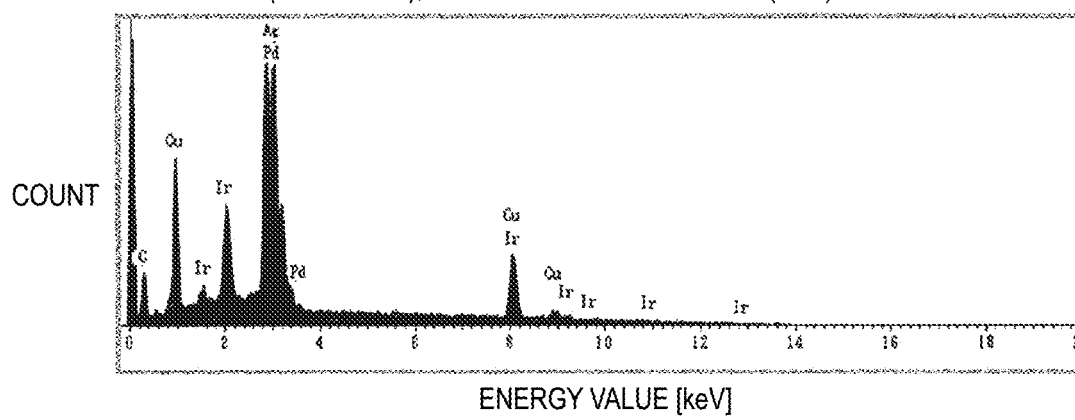
FIG. 19 is a view illustrating a result obtained by performing qualitative analysis on a sample of the second test using EDX.
Figure 20:
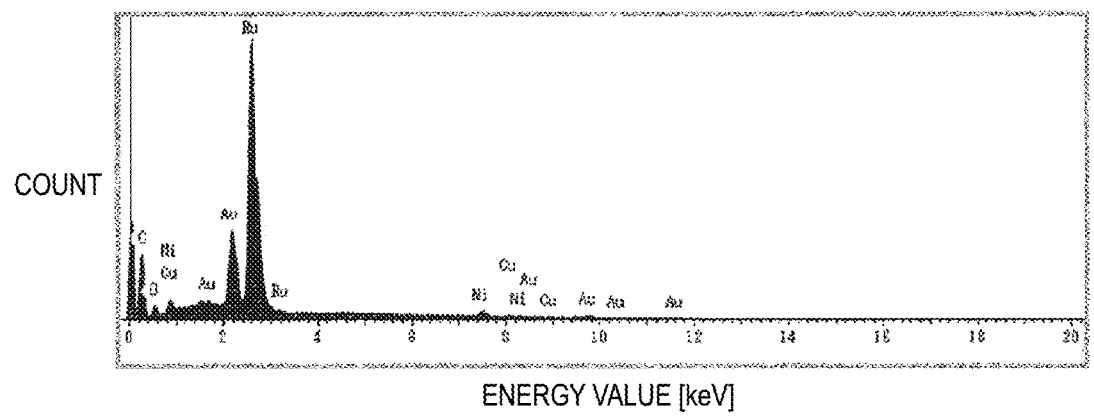
FIG. 20 is a view illustrating a result obtained by performing qualitative analysis on a sample of the second test using EDX.
Figure 21:
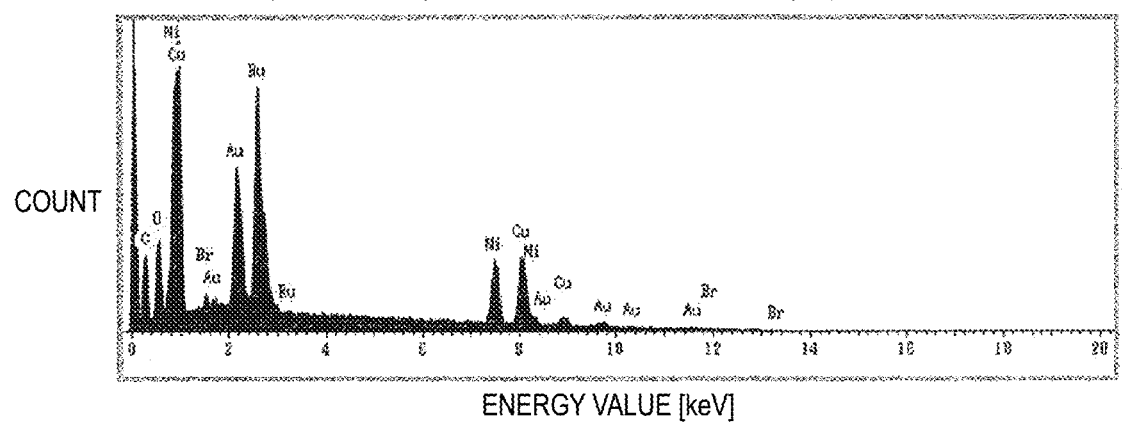
FIG. 21 is a view illustrating a result obtained by performing qualitative analysis on a sample of the second test using EDX.
Figures 22, 23:
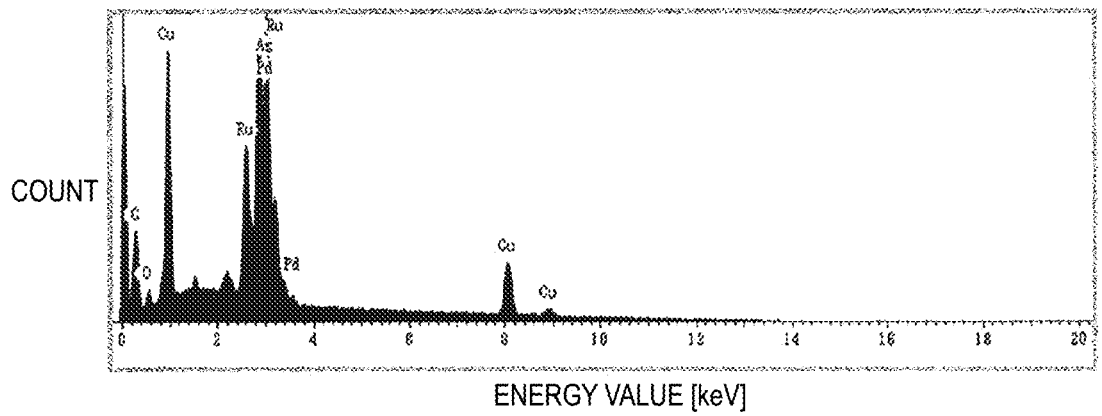
FIG. 22 is a view illustrating a result obtained by performing qualitative analysis on a sample of the second test using EDX.
FIG. 23 is a view illustrating compositions of samples which are test objects of a third test.

As the component analysis on the melted materials generated at the tip parts of the samples after the test, qualitative analysis using EDX was carried out. FIG. 17 to FIG. 22 show the results of component analysis on the melted materials generated at the tip parts of the individual samples. In all of those figures, the horizontal axis represents the energy values (keV) of characteristic X-rays, and the vertical axis represents counts, and in the graphs, elements corresponding to intrinsic energy values are written together. The larger the count, the higher the content of the corresponding element in the melted material. FIG. 17 shows the result of component analysis on the sample E (the Ir coating) after the test under the conduction condition γ (the impressed current of 2 A). FIG. 18 shows the result of component analysis on the sample E (the Ir coating) after the test under the conduction condition δ (the impressed current of 5 A). FIG. 19 shows the result of component analysis on the sample E (the Ir coating) after the test under the conduction condition ε (the impressed current of 15 A). FIG. 20 shows the result of qualitative analysis on the sample F (the Ru coating) after the test under the conduction condition γ (the impressed current of 2 A). FIG. 21 shows the result of qualitative analysis on the sample F (the Ru coating) after the test under the conduction condition δ (the impressed current of 5 A). FIG. 22 shows the result of qualitative analysis on the sample F (the Ru coating) after the test under the conduction condition ε (the impressed current of 15 A).

According to FIG. 17 to FIG. 22, in the case of both of the samples E and F, the melted materials generated at the tip parts after the tests under the conduction condition γ (the impressed current of 2 A) and the conduction condition δ (the impressed current of 5 A) do not contain palladium Pd. Meanwhile, the melted materials generated at the tip parts after the test under the conduction condition ε (the impressed current of 15 A) contain palladium Pd. Palladium Pd is the material of the plunger base materials of the samples.

As shown in the photographs of FIG. 15, the melted materials generated at the tip parts of the samples E and F after the tests under the conduction conditions γ and δ are the results of melting of the platinum group layers 13 (the Ru coating layer or the Ru coating layer). It can be seen that the platinum group layers 13 formed at the tip parts of the samples were melted by sparks but did not melt in such an extent as to expose the plunger base materials. Meanwhile, it can be seen that in the case of the samples E and F after the test under the conduction condition ε (the impressed current of 15 A), melting occurred in the tip parts over wide ranges, and in addition to melting of the platinum group layers 13 (the Ru coating layer and the Ir coating layer), the plunger base materials melted.

(C) Third Test

In the third test, conduction durability evaluation was carried out. The third test is different from the first test in that as an inspection object to be brought into contact with the tip parts of samples, a solder bar was used. In the third test, three kinds of samples (samples G, H, and I) were prepared, and conduction durability evaluation on them was carried out as in the first test. The compositions of the test object samples are shown in FIG. 23, and test conditions of the third test are shown in FIG. 24.

As shown in FIG. 23, of the three kinds of samples G, H, and I used in the third test, the sample G is for comparison, and is a sample made without forming any coating layer such as a gold (Au) layer or a platinum group layer 13 on the plunger base material. The sample H is a sample made by applying base plating (strike plating) on the plunger base material with gold (Au) and forming a coating layer of iridium (Ir). The thickness of the Ir coating layer is 0.5 μm. This sample H has the same composition as that of the sample B used in the first test, and is a sample having the iridium (Ir) layer as a platinum group layer 13 of the present embodiment. The sample I is a sample made by applying base plating (strike plating) on the plunger base material with gold (Au) and forming a coating layer of ruthenium (Ru). The thickness of the Ru coating layer is 1 μm. This sample I has the same composition as that of the sample C used in the first test, and is a sample having the ruthenium (Ru) layer as a platinum group layer 13 of the present embodiment.

As shown in FIG. 24, in the third test, tests were carried out under three types of conduction conditions (conduction conditions η, θ, and λ). The conduction conditions η, θ, and λ are the same in the impressing time and the number of times of conduction, but are different in the impressed currents. The conduction condition η is a condition in which conduction with an impressed current of 5 A and an impressing time of 20 ms should be repeatedly performed 12,500 times. The conduction condition θ is a condition in which conduction with an impressed current of 8 A and an impressing time of 20 ms should be repeatedly performed 12,500 times. The conduction condition λ is a condition in which conduction with an impressed current of 12 A and an impressing time of 20 ms should be repeatedly performed 12,500 times.

Figure 25:
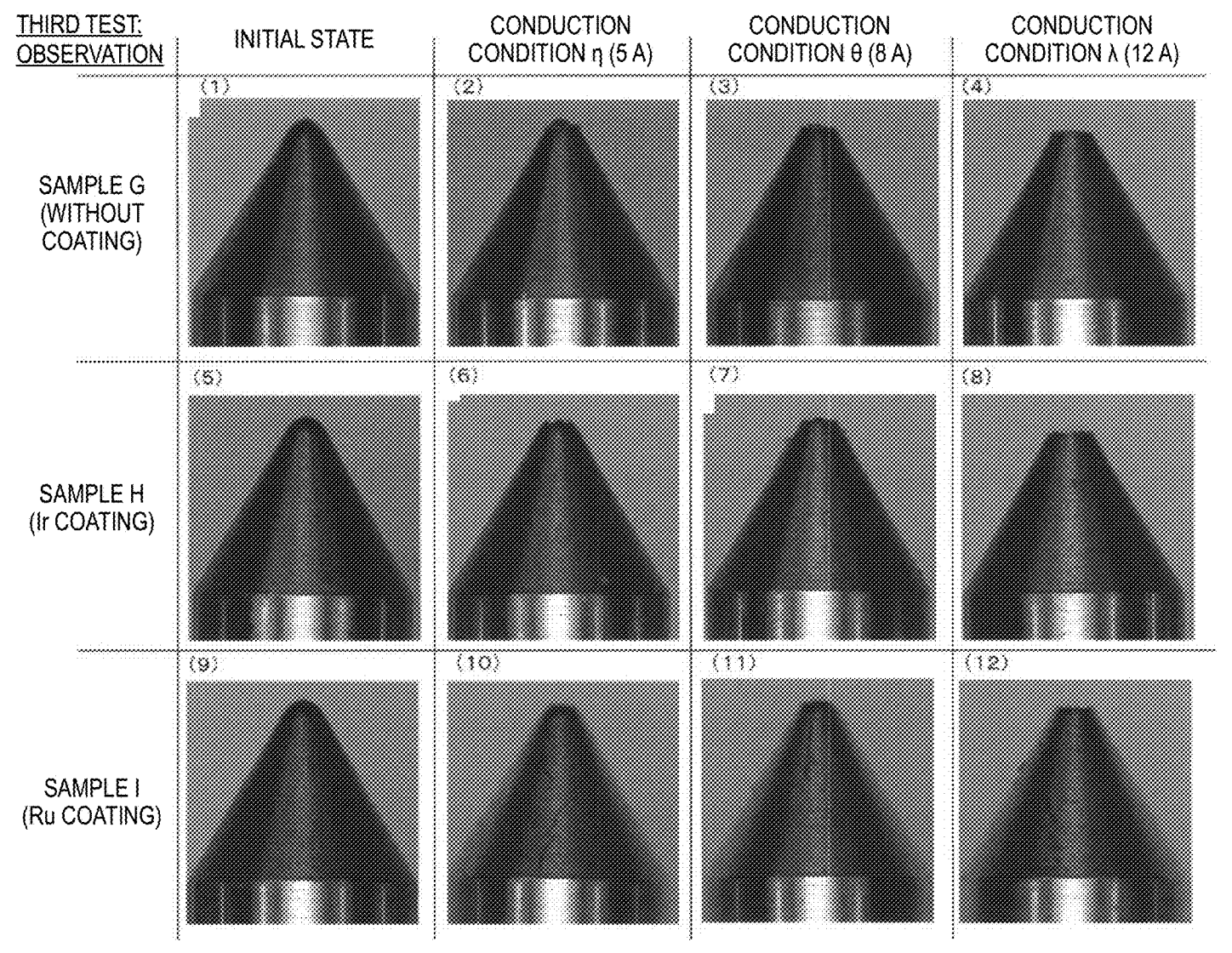
Figure 26:
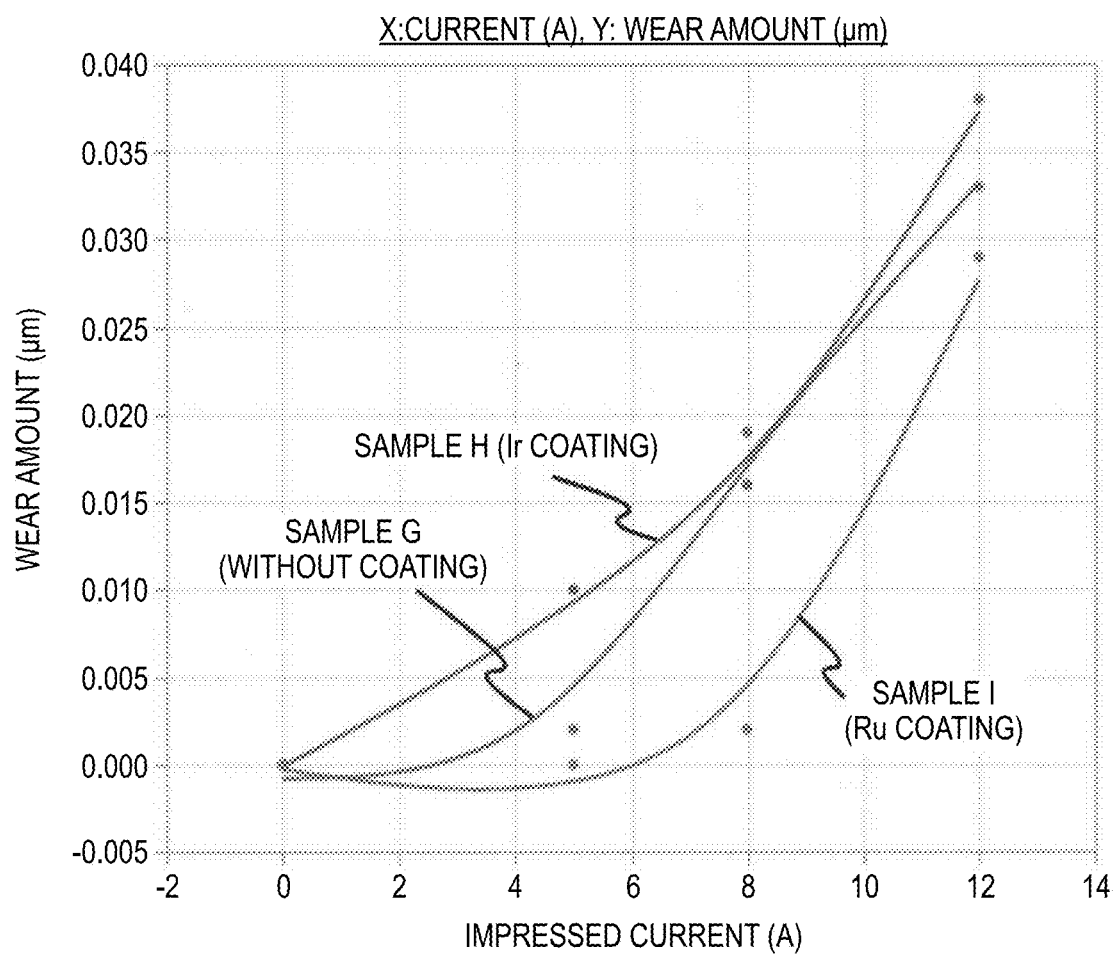
FIG. 26 is a view illustrating measurement results of the wear amounts of the samples of the third test.

FIG. 25 to FIG. 27 show the results of the third test. FIG. 25 shows enlarged photographs of the tip parts of the samples as seen from the traverse direction. In FIG. 25, twelve photographs are denoted by (1) to (12). (1) to (4) are photographs of the sample G (without any coating). (5) to (8) are photographs of the sample H (the Ir coating). (9) to (12) are photographs of the sample I (the Ru coating). Further, (1), (5), and (9) are photographs of the initial states before the test. (2), (6), and (10) are photographs of the states after the test under the conduction condition η (the impressed current of 5 A). (3), (7), and (11) are photographs of the states after the test under the conduction condition θ (the impressed current of 8 A). (4), (8), and (12) are photographs of the states after the test under the conduction condition λ (the impressed current of 12 A).

According to FIG. 25, with respect to all of the samples G, H, and I, if comparing the states after the tests under the conduction conditions η, θ, and λ with the initial states, it can be seen that the tip parts wore. If comparing them with the tip parts of the samples of the first test (see FIG. 4), it can be seen that the degrees of wear are higher. The samples H and I have the same compositions as those of the samples B and C of the first test, respectively. All of the conduction conditions ζ, θ, and λ are conditions in which the impressed currents are lower than those of the conduction conditions α and β of the first test. Therefore, in the case where the inspection object is a solder bar, the tip parts of the samples are more likely to wear as compared to the case of the PPF leadframe used as an inspection object in the first test.

FIG. 26 shows the measurement results of the wear amounts of the tip parts of the individual samples. FIG. 26 shows a graph in which the horizontal axis represents the impressed currents corresponding to the conduction conditions and the vertical axis represents the wear amounts. With respect to the samples G, H, and I, the wear amounts of the tip parts measured in the initial states (where the impressed current was 0 A) and the states after the tests of the conduction conditions η, θ, and λ are shown as plots. Further, fitting curves for the individual plots are tentatively shown.

According to FIG. 26, it can be seen that even in all of the samples G, H, and I, as the impressed currents increase, the wear amounts of the tip parts increase. Further, when the wear amounts of the samples H and I are compared with the wear amount of the sample G, the differences are about several nanometers to several tens of nanometers, and the wear amount of the sample I is smaller than the wear amount of the sample H.

Figure 27A:
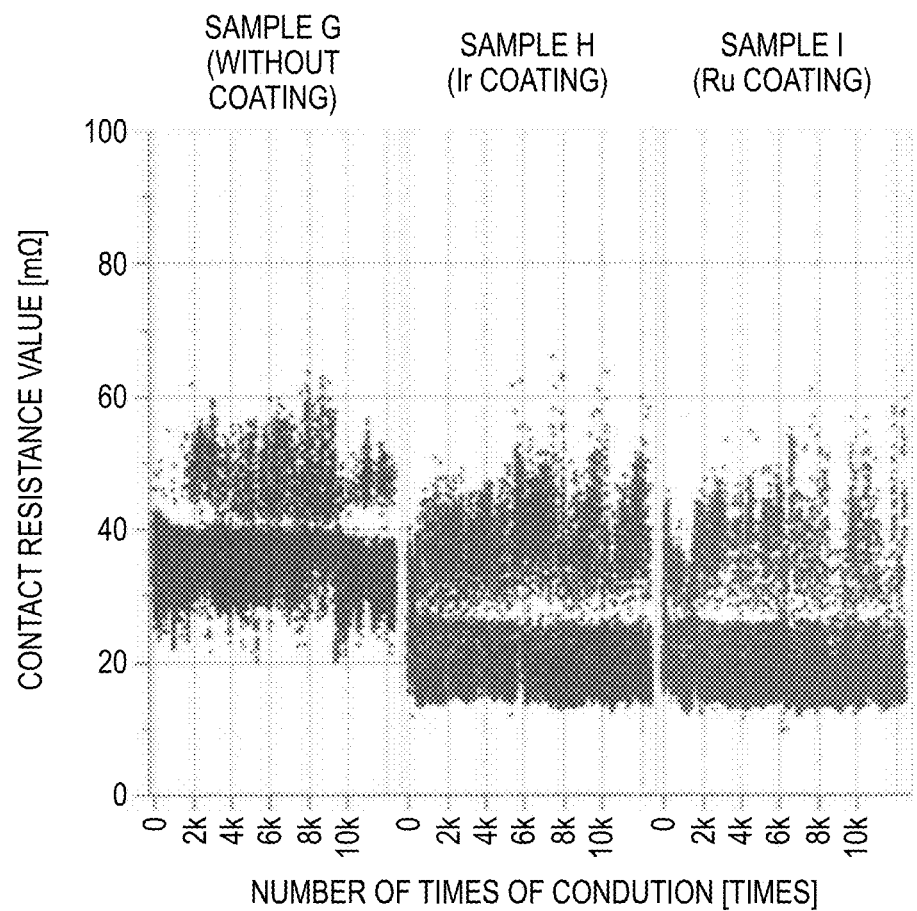
FIG. 27A is a view illustrating measurement results of the contact resistance values of the samples of the third test.
Figure 27B:
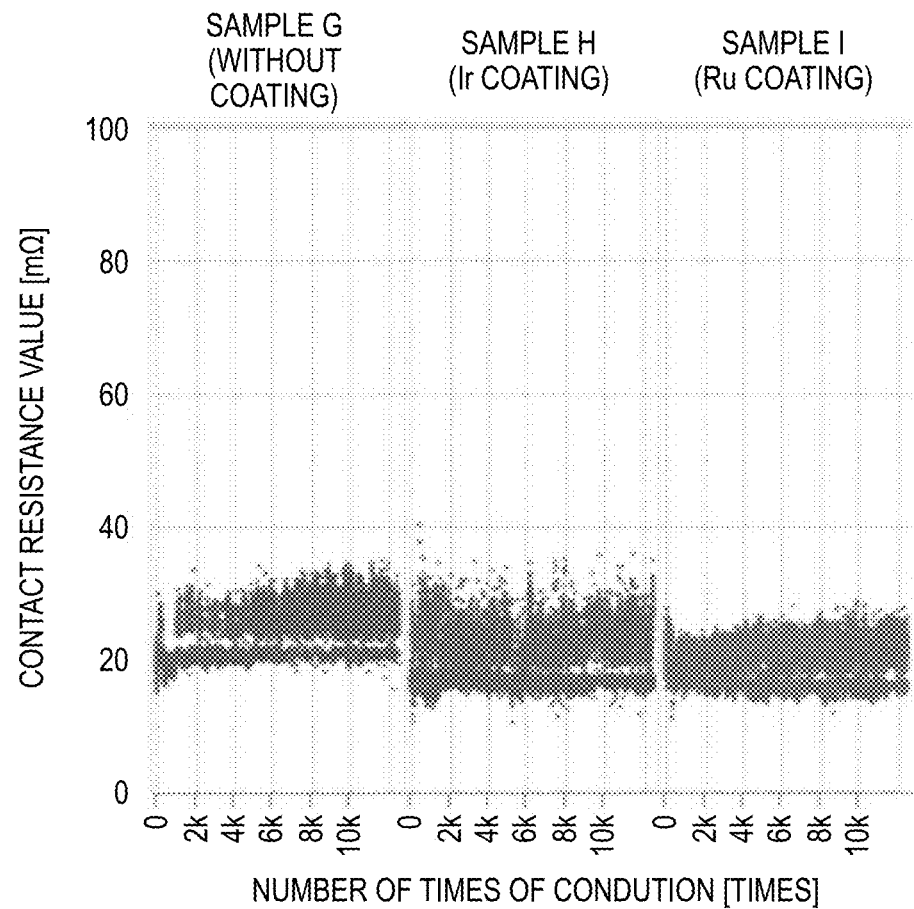
FIG. 27B is a view illustrating the measurement results of the contact resistance values of the samples of the third test.
Figures 27C, 28:
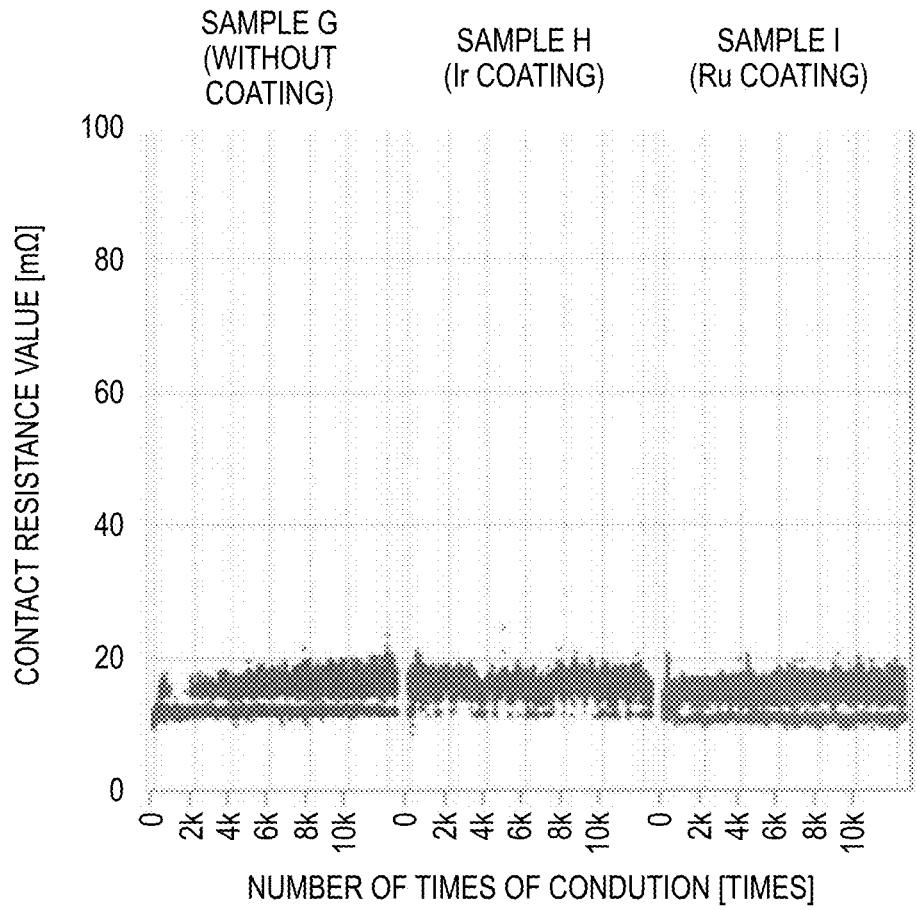
FIG. 27C is a view illustrating the measurement results of the contact resistance values of the samples of the third test.
FIG. 28 is a view illustrating compositions of samples of a fourth test.

In the third test, the contact resistance value between the tip part of each sample and the inspection object was measured whenever conduction was performed. FIG. 27A to FIG. 27C show the measurement results of the contact resistance values of the tip parts of the individual samples. Three graph sets each of which consists of three graphs are shown in FIG. 27A to FIG. 27C. FIG. 27A shows a graph set related to the test under the conduction condition η. FIG. 27B shows a graph set related to the test under the conduction condition θ. FIG. 27C shows a graph set related to the test under the conduction condition λ. Further, three graphs of each graph set are graphs related to the samples G, H, and I in order from left to right, respectively. Each graph is a graph in which the horizontal axis represents the number of times of conduction, and the vertical axis represents the contact resistance value, and contact resistance values measured whenever conduction was performed are shown as a plot.

According to FIG. 27A to FIG. 27C, in all of the graphs, the contact resistance values rarely change due to the increase in the number of times of conduction. The contact resistance values do not increase (deteriorate) due to repeating of conduction. Under each of the conduction conditions η, θ, and λ, the contact resistance values of the samples H and I are almost the same as or slightly smaller than the contact resistance value of the sample G (without any coating). Therefore, if a platinum group layer 13 which is a Ru coating layer or an Ir coating layer is formed at a tip part to come into contact with inspection objects, the contact resistance value does not increase (deteriorate) and there is no problem with the basic performance of the plunger. As shown in FIG. 26, the tip parts of samples wear due to repeating of conduction; however, this wear does not cause the contact resistance values to increase (deteriorate).

(D) Fourth Test

In the fourth test, conduction durability evaluation was carried out. The fourth test is different from the first test in that the fourth test used samples having thinner Ru coating layers. In the fourth test, two kinds of samples (samples J and K) were prepared, and conduction durability evaluation on them was carried out as in the first test. The compositions of the test object samples are shown in FIG. 28, and a test condition of the fourth test are shown in FIG. 29.

As shown in FIG. 28, the sample J is a sample made by applying base plating (strike plating) on the tip part of a plunger base material with gold (Au) and forming a coating layer of ruthenium (Ru). The thickness of the Ru coating layer is 20.8 nm (0.0208 μm). The sample K is a sample made by applying base plating (strike plating) on the tip part of a plunger base material with gold (Au) and forming a coating layer of ruthenium (Ru). The thickness of the Ru coating layer is 185 nm (0.185 μm). It can be said that both of the samples have the ruthenium (Ru) layers as platinum group layers 13 of the present embodiment.

As shown in FIG. 29, in the fourth test, the test was carried out under a conduction condition μ. The conduction condition μ is a condition in which conduction with an impressed current of 15 A and an impressing time of 20 ms should be repeatedly performed 25,000 times. This conduction condition μ is the same as the conduction condition β of the first test. Further, an inspection object is a PPF leadframe as in the first test.

FIG. 30, and FIG. 31A to FIG. 31C show the results of the fourth test. FIG. 30 shows enlarged photographs of the tip parts of the samples as seen from the traverse direction. In FIG. 30, four photographs are denoted by (1) to (4). (1) and (2) are photographs of the sample J. (3) and (4) are photographs of the sample K. Further, (1) and (3) are photographs of the initial states before the test. (2) and (4) are photographs of the states after the test under the conduction condition μ. (25,000 times of conduction). When the states after the test under the conduction condition μ are compared with the initial states, in both of the samples J and K, exceptional wear at the tip parts is not observed.

Figure 31A:
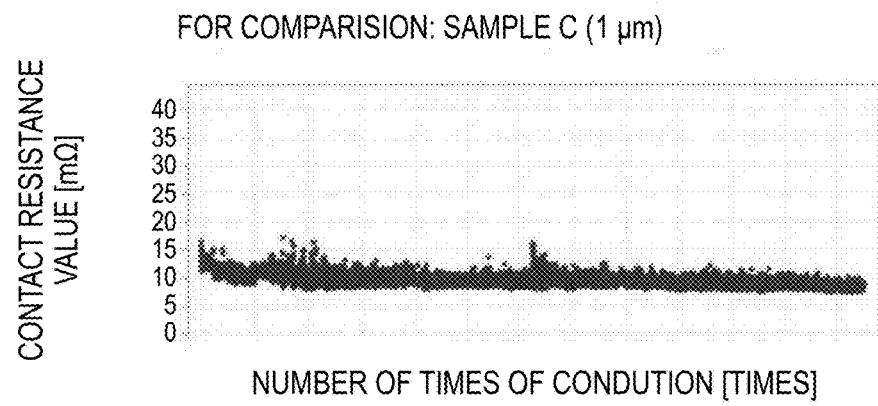
FIG. 31A is a view illustrating measurement result of the contact resistance value of a sample for comparison in the fourth test.
Figure 31B:
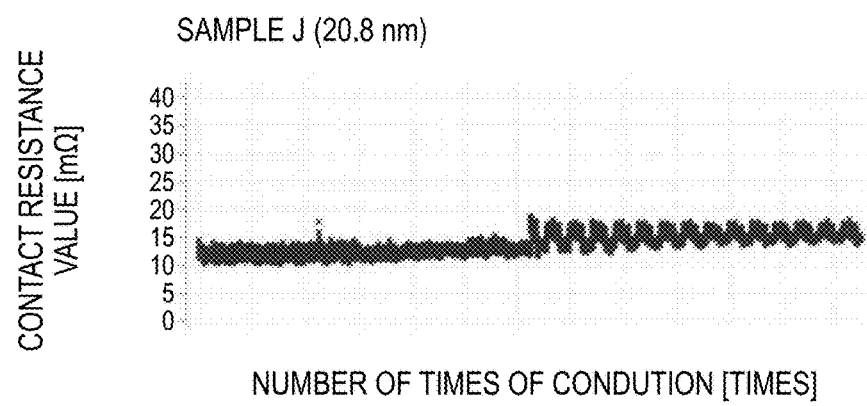
FIG. 31B is a view illustrating the measurement result of the contact resistance value of a sample J of the fourth test.
Figure 31C:
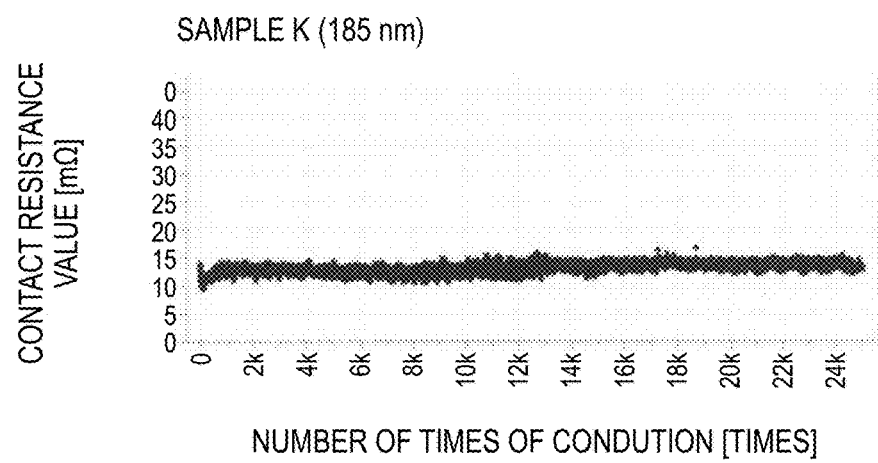
FIG. 31C is a view illustrating the measurement result of the contact resistance value of a sample K of the fourth test.

FIG. 31A to FIG. 31C show the measurement results of the contact resistance values of the individual samples. FIG. 31A shows a graph of the contact resistance value of the sample C used in the first test. FIG. 31B shows a graph of the contact resistance value of the sample J of the fourth test. FIG. 31C shows a graph of the contact resistance value of the sample K. The graph of the sample C with the Ru coating layer having a thickness of 1 μm, shown in FIG. 31A, is for comparison. Each graph is a graph in which the horizontal axis represents the number of times of conduction, and the vertical axis represents the contact resistance value, and contact resistance values measured whenever conduction was performed are shown as a plot.

According to FIG. 31A to 31C, in all of the samples C, J, and K, the contact resistance values rarely change due to the increase in the number of times of conduction. In other words, the contact resistance values rarely increase (deteriorate) due to repeating of conduction. When the contact resistance values of the samples J and K are compared with the contact resistance value of the sample C, the differences are almost the same, and are about several ma Therefore, even if the thickness of the Ru coating layer is reduced to 20 nm, the contact resistance value does not increase (deteriorate). Coating layers containing platinum group elements, such as an Ir coating layer, a Rh coating layer, and an Os coating layer have the same effect as that of the Ru coating layer.

(E) Fifth Test

In the fifth test, conduction durability evaluation was carried out. The fifth test is a test in which samples having plunger base material made of a beryllium copper (BeCu) alloy were used, unlike in the first to fourth tests described above. In the fifth test, one kind of sample (a sample L) was prepared, and conduction durability evaluation on it was carried out. The composition of the test object sample is shown in FIG. 32, and a test condition of the fifth test are shown in FIG. 33.

Figures 32, 33, 34A:
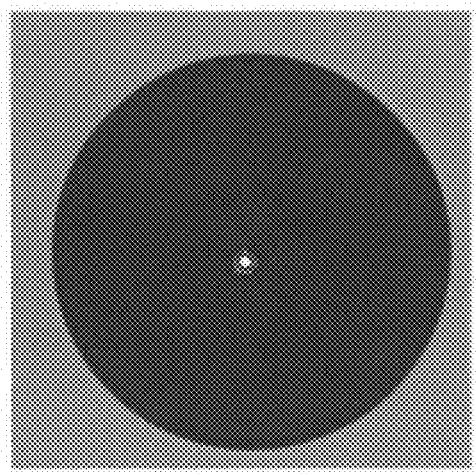
FIG. 32 is a view illustrating composition of a sample of a fifth test.
FIG. 33 is a view illustrating a test condition of the fifth test.
FIG. 34A shows an enlarged photograph of an upper surface of the sample of the fifth test.
Figure 34B:
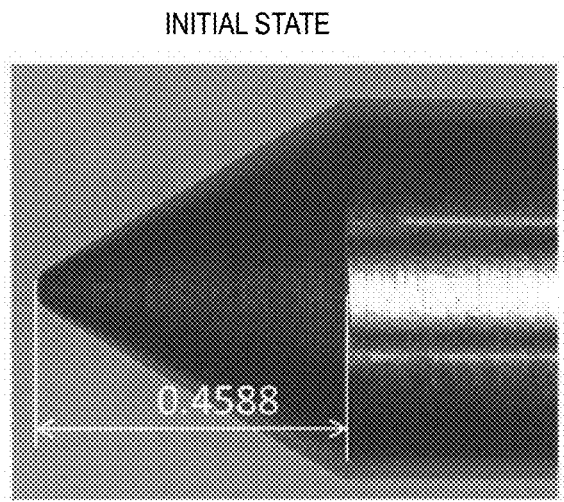
FIG. 34B shows an enlarged photograph of a side surface of the sample of the fifth test.
Figure 35A:
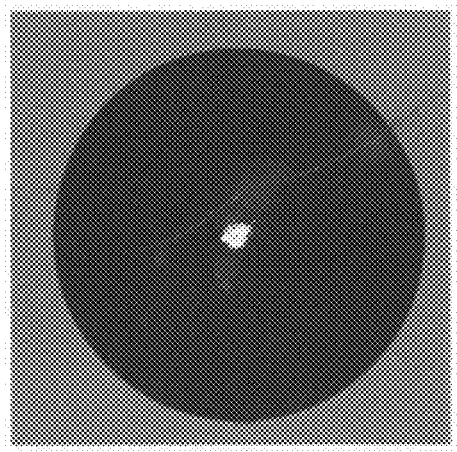
FIG. 35A shows an enlarged photograph of the upper surface of the sample of the fifth test.
Figure 35B:
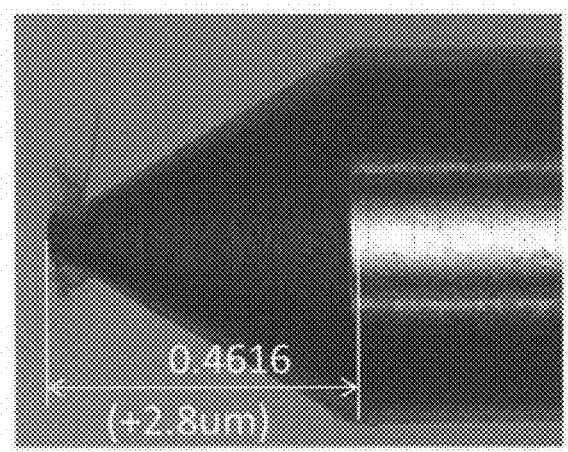
FIG. 35B shows an enlarged photograph of the side surface of the sample of the fifth test.

As shown in FIG. 32, the sample L is a sample made by applying base plating (strike plating) on the tip part of a plunger base material consisting of a beryllium copper (BeCu) alloy with palladium (Pd) and forming a coating layer of ruthenium (Ru). The thickness of the Ru coating layer is 1.0 μm.

As shown in FIG. 33, in the fifth test, the test was carried out under a conduction condition ν. The conduction condition ν is a condition in which conduction with an impressed current of 15 A and an impressing time of 20 ms should be repeatedly performed 25,000 times. This conduction condition v is the same as the conduction condition β of the first test. An inspection object is a PPF leadframe as in the first test.

FIG. 34A to FIG. 39 show the results of the fifth test. FIG. 34A to FIG. 34B are enlarged photographs of the tip part of the sample L in the initial state. FIG. 34A is a photograph of the upper surface of the tip part taken as viewed from above. FIG. 34B is a photograph of the side surface of the tip part as seen from the traverse direction. FIG. 35A and FIG. 35B are enlarged photographs of the tip part of the sample L in the state after the test under the conduction condition v. FIG. 35A is a photograph of the upper surface of the tip part taken as viewed from above. FIG. 35B is a photograph of the side surface of the tip part as seen from the traverse direction. According to FIG. 34A, FIG. 34B, FIG. 35A, and FIG. 35B, if comparing the state after the test under the conduction condition v with the initial state, it can be seen that wear is not observed at the tip part of the sample L but there is some adhered substance.

Figure 36:
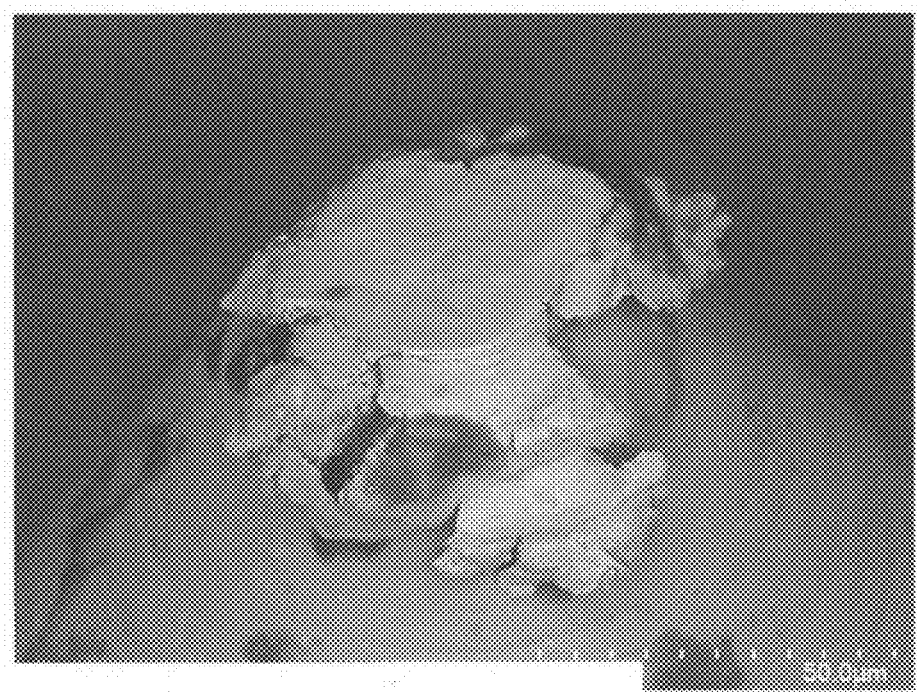
FIG. 36 shows an electron micrograph of the sample of the fifth test.

FIG. 36 shows another electron micrograph of the tip part of the sample L in the state after the test under the conduction condition v which is a photograph taken by a scanning electron microscope (SEM). According to FIG. 36, it can be seen that cracks or melting did not occur in the Ru coating layer formed at the tip part of the sample L, and there is some adhered substance deposited on the surface of the Ru coating layer.

Figure 37A:
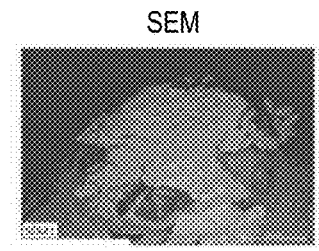
FIG. 37A shows an image taken in the fifth test by a SEM.
Figure 37B:
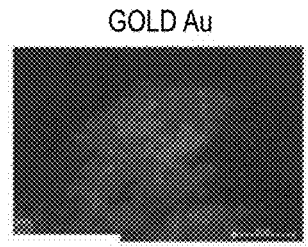
FIG. 37B shows an image of the gold (Au) component taken in the fifth test by EDX.
Figure 37C:
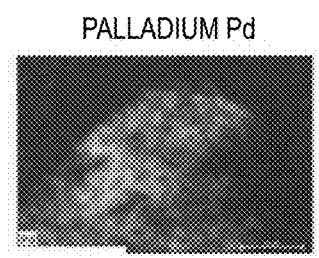
FIG. 37C shows an image of the palladium (Pd) component taken in the fifth test by EDX.
Figure 37D:
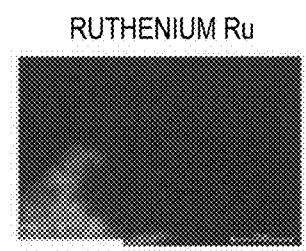
FIG. 37D shows an image of the ruthenium (Ru) component taken in the fifth test by EDX.
Figure 37E:
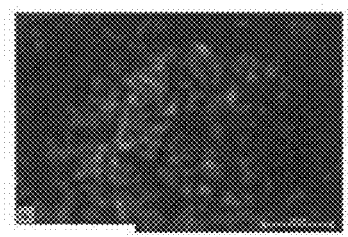
FIG. 37E shows an image of the nickel (Ni) component taken in the fifth test by EDX.
Figure 37F:
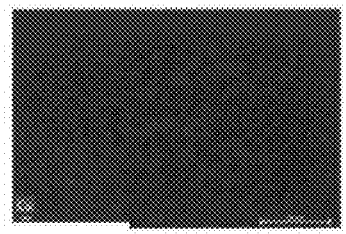
FIG. 37F shows an image of the copper (Cu) component taken in the fifth test by EDX.

Subsequently, on this adhered substance, component analysis using EDX was carried out. FIG. 37A to FIG. 37F show component images of the adhered substance taken by EDX. Six images are shown as FIG. 37A to FIG. 37F. FIG. 37A is an image taken by a scanning electron microscope (SEM). FIG. 37B is a gold (Au) component image. FIG. 37C is a palladium (Pd) component image. FIG. 37D is a ruthenium (Ru) component image. FIG. 37E is a nickel (Ni) component image. FIG. 37F is a copper (Cu) component image. In the component images, white or gray parts are parts containing corresponding components, and higher brightness indicates higher component concentration.

Figure 38:
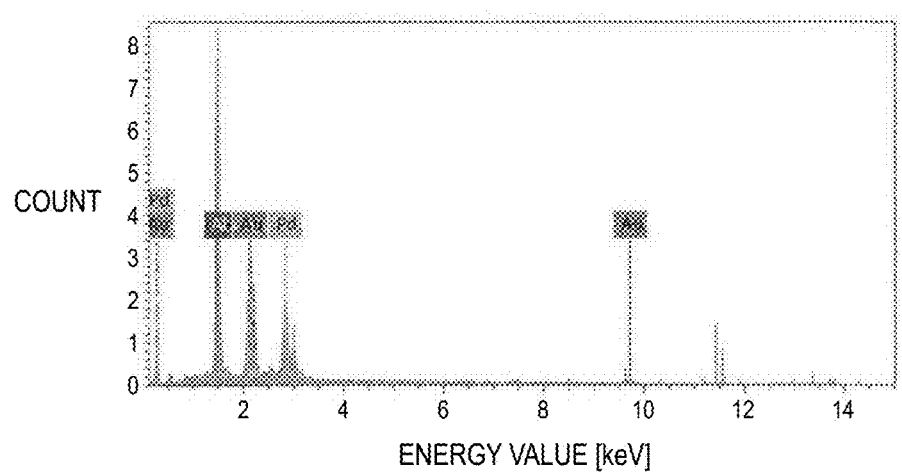
FIG. 38 is a view illustrating a result of qualitative analysis carried out in the fifth test by EDX.

FIG. 38 shows a graph of the result of qualitative analysis using EDX on the adhered substance. In FIG. 38, the horizontal axis represents the energy values (keV) of characteristic X-rays, and the vertical axis represents counts, and in the graph, elements corresponding to intrinsic energy values are written together.

According to FIG. 37A to FIG. 37F, and FIG. 38, the adhered substance contains palladium (Pd) and gold (Au) as main components, but does not contain ruthenium (Ru). Therefore, it can be presumed that the adhered substance is not a result of melting of the Ru coating layer, and was deposited by transfer of the components of the PPF leadframe brought as an inspection object into contact with the tip part of the sample.

FIG. 39 shows the measurement results of the contact resistance value of the tip part of the sample L. FIG. 39 shows a graph in which the horizontal axis represents the number of times of conduction, and the vertical axis represents the contact resistance value, and contact resistance values measured whenever conduction was performed are shown as a plot. According to FIG. 39, after start of conduction (up to about 2,000 times of conduction), the contact resistance value slightly increased; however, since then, the contact resistance value rarely changed although the number of times of conduction increased. In other words, repeating of conduction does not cause the contact resistance value to increase (deteriorate), so there is no problem with the basic performance of the plunger.

(F) Sixth Test

In the sixth test, conduction durability evaluation was carried out. The sixth test is different from the third test in that conduction was performed for a long time in the state where the tip part of each sample was in contact with a solder material. In the sixth test, six kinds of samples (samples P, Q, R, S, T, and U) were prepared, and conduction durability evaluation on them was carried out. The compositions of the test object samples are shown in FIG. 40, and a test condition of the sixth test is shown in FIG. 41.

As shown in FIG. 40, the samples P, Q, R, S, and T are different from the sample U in the materials of their plunger base materials. The plunger base materials of the samples P, Q, R, S, and T are a palladium (Pd) alloy. The plunger base material of the sample U is a beryllium copper (BeCu) alloy. Of the six kinds of samples P, Q, R, S, T, and U, the sample P is a sample for comparison having an uncoated tip part not subjected to surface treatment.

The sample Q is a sample including a plunger base material having a tip part subjected to DLC (Diamond-Like Carbon) coating (also referred to as DLC film coating). The sample R is a sample including a plunger base material having a tip part with a rhodium (Rh) coating layer. The thickness of the Rh coating layer is 1.0 μm. The sample S is a sample including a plunger base material having a tip part with a Ru coating layer. The thickness of the Ru coating layer is 1.0 μm. The sample T is a sample including a plunger base material having a tip part with a gold (Au) coating layer. The thickness of the Au coating layer is 1.0 μm.

The sample U is a sample including a plunger base material having a tip part with three coating layers of nickel, palladium, and ruthenium (Ni, Pd, and Ru). The total thickness of the Ni, Pd, and Ru coating layers is 1.0 μm.

As shown in FIG. 41, in the sixth test, the test was carried out under a conduction condition ξ. The conduction condition ξ is a condition in which conduction with an impressed current of 1 A and an impressing time of 72 hours (h) should be performed at an atmospheric temperature of 120° C. in the state where the tip part of each sample is in contact with an inspection object. A harsh condition in the case where device inspection had been carried out at high temperature for a long time was assumed. The inspection object is a solder material (a solder block), and is so-called low-melting-point solder.

Figure 42C:
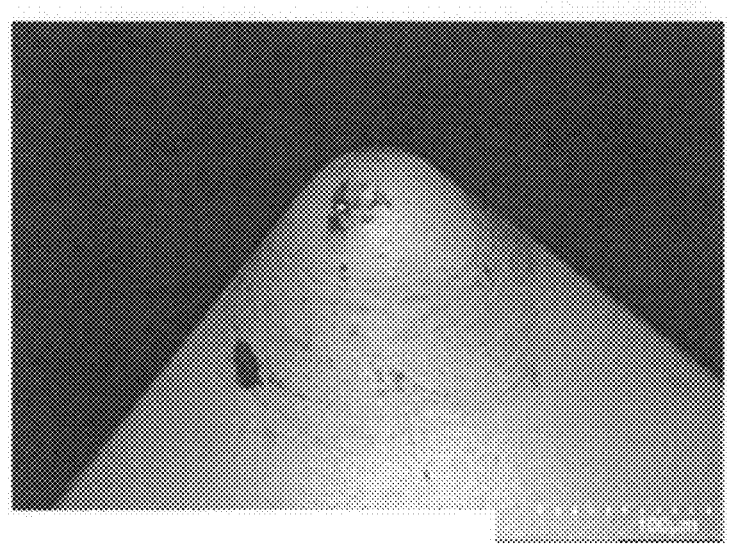
FIG. 42C shows an electron micrograph of a sample R of the sixth test.
Figure 42D:
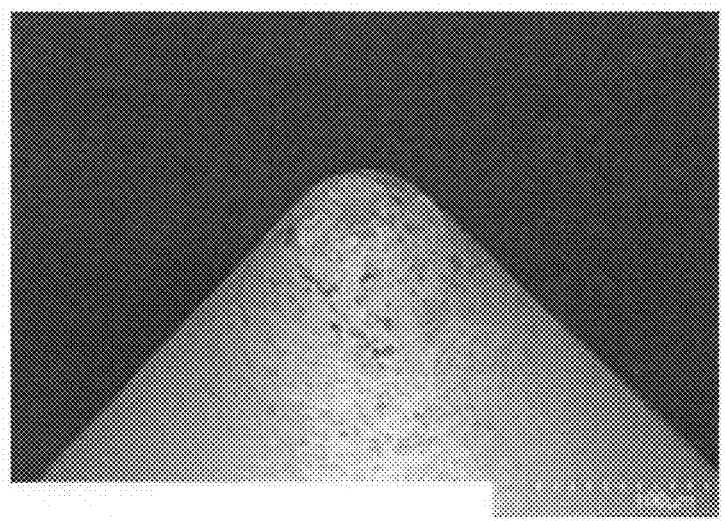
FIG. 42D shows an electron micrograph of a sample S of the sixth test.
Figure 42E:
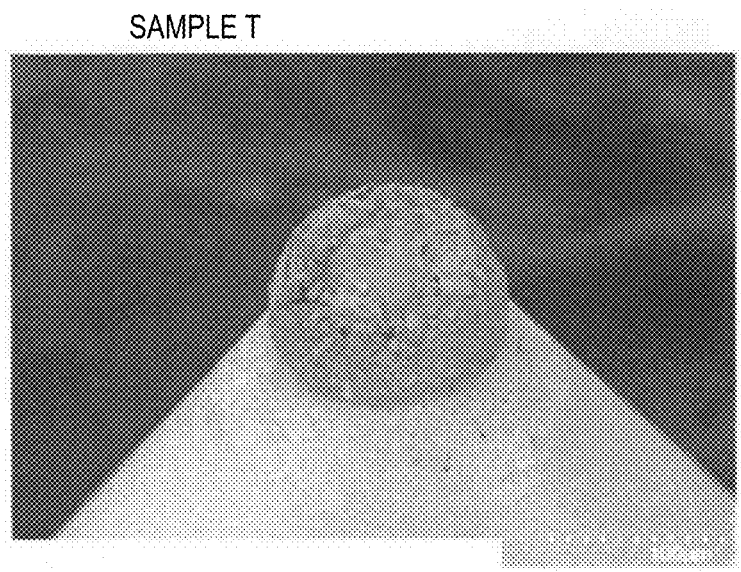
FIG. 42E shows an electron micrograph of a sample T of the sixth test.
Figure 42F:
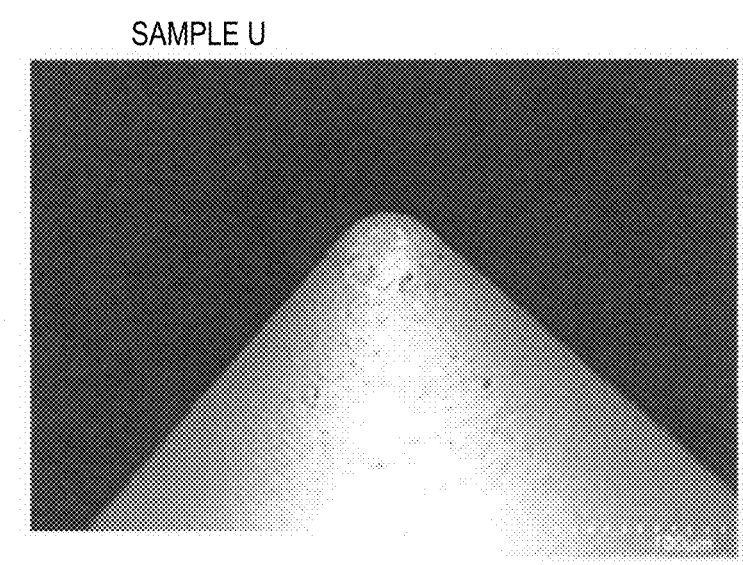
FIG. 42F shows an electron micrograph of a sample U of the sixth test.

FIG. 42A to FIG. 42F show the results of the sixth test. They show electron micrographs of the states of the individual samples after the test which are photographs of the tip parts taken as viewed diagonally from above. FIG. 42A is a photograph of the sample P, FIG. 42B is a photograph of the sample Q, and FIG. 42C is a photograph of the sample R. FIG. 42D is a photograph of the sample S, FIG. 42E is a photograph of the sample T, and FIG. 42F is a photograph of the sample U.

According to FIG. 42A, it can be seen that in the case of the sample P including the uncoated plunger base material consisting of the Pd alloy, the components of the Pd alloy and Sn (tin) which is a component of the solder reacted, whereby an alloy of Pd and Sn was generated on the tip part. The tip part of the sample P wore.

According to FIG. 42B to FIG. 42F, it can be seen that the samples Q, R, S, T, and U did not wear at the tip parts. According to FIG. 42E, although there is Sn (tin) on the tip part of the sample T, erosion was not caused by the solder, and wear did not occur at the tip part.

[Observations]

In order to evaluate the tip parts of the first plunger 10 and the second plunger 20 included in the contact probe 1, the six types of tests (the first to sixth tests) were carried out on the samples simulating the first plunger 10. From the results of these tests, it was confirmed that if a platinum group layer 13 contains a platinum group element as a main component such as ruthenium (Ru), iridium (Ir), and rhodium (Rh), as a coating layer having a thickness of 0.02 µm, on the tip part of a plunger, even during a high-current conduction inspection, the tip part which comes into contact with an inspection object is unlikely to abrade or wear.

In the first test, in the case of both of the sample B and the sample C, after conduction of the high current of 15 A was repeatedly performed 25,000 times, remarkable wear was not observed at the tip parts. The sample B is a plunger having a coating layer of iridium (Ir) (an Ir coating layer) having a thickness of 0.5 µm. The sample C is a plunger having a coating layer of ruthenium (Ru) (an Ru coating layer) having a thickness of 1.0 µm.

Therefore, if a coating layer of iridium (Ir) (an Ir coating layer) with a thickness of 0.5 µm, or a coating layer of ruthenium (Ru) (an Ru coating layer) with a thickness of 1.0 µm is formed as the platinum group layer 13 of the first plunger 10, it has resistance to repetitive conduction of high current. Especially, in the case of the sample C having the Ru coating layer with a thickness of 1.0 µm, since melting and cracks did not occur at the tip part, it has better resistance to repetitive conduction.

In the second test, in the case of both of the samples E and F which are samples identical to the samples B and C of the first test, respectively, after the sparks were generated by the impressed currents of 2 A and 5 A, their tip parts slightly melted, but cracks, breakage, and so on did not occur. After the sparks were generated by the impressed current of 15 A which was a high current, the Ru coating layer or the Ir coating layer of their tip parts melted, but the inner plunger base materials did not melt.

Therefore, if a coating layer of iridium (Ir) (an Ir coating layer) with a thickness of 0.5 µm, or a coating layer of ruthenium (Ru) (an Ru coating layer) with a thickness of 1.0 µm is formed as the platinum group layer 13 of the first plunger 10, it has sufficient spark resistance. Especially, the sample F having the Ru coating layer has better resistance to sparks since it has a melting size smaller than that of the sample E having the Ir coating layer.

In the third test, in the case where the solder bar was used as an inspection object, in the case of both of the samples H and I which are samples identical to the samples B and C of the first test, respectively, the wear amounts of the tip parts after conduction of the high current of 12 A was repeatedly performed 12,500 times were the same as or smaller than that of the sample G having no coating layer.

Therefore, if a coating layer of iridium (Ir) (an Ir coating layer) with a thickness of 0.5 µm, or a coating layer of ruthenium (Ru) (an Ru coating layer) with a thickness of 1.0 µm is formed as the platinum group layer 13 of the first plunger 10, it is possible to reduce abrasion and wear in the case where an electrode of an inspection object which comes into contact with the tip part of the first plunger 10 is a solder bump or a solder ball. Especially, the sample I having the Ru coating layer is more appropriate to reduce abrasion and wear, since it has a wear amount smaller than that of the sample H having the Ir coating layer.

In the fourth test, in the case of both of the sample J having the Ru coating layer with the thickness of 20.8 nm and the sample K having the Ru coating layer with the thickness of 185 nm, after conduction of the high current of 15 A was repeatedly performed 25,000 times, exceptional wear was not observed at the tip parts. It also was confirmed that the repetitive conduction did not cause the contact resistance values between the tips of the samples and the inspection object to increase (deteriorate).

Therefore, in the case of the Ru coating layers which exhibited particularly excellent resistance in the first to third tests, even if they have a smaller thickness of 20.8 nm (about 0.02 µm), similarly, they have resistance to repetitive conduction of high current. The thickness of the platinum group layer 13 of the first plunger 10 needs to be 0.02 µm or larger at least.

In the fifth test, in the case of the sample L using beryllium copper (BeCu) which is a material different from the palladium (Pd) alloy used in the first to fourth tests, conduction of the high current of 15 A was repeatedly performed 25,000 times. However, exceptional wear was not observed at the tip part. In the case of the sample L, an increase in the contact resistance value attributable to repetitive conduction was not observed.

Therefore, it was confirmed that in order to have good resistance such that abrasion and wear is hardly occurred during high-current conduction inspection, it is needed to form a platinum group layer 13 using a Ru coating layer or an Ir coating layer on the tip end portion, and the material of the plunger base material 11 is not limited.

In the sixth test, on various samples, conduction durability evaluation was carried out by performing conduction of the current of 1 A at the atmospheric temperature of 120° C. for 72 hours in the state where the tip parts were in contact with the solder material. The used samples are the samples P, Q, R, S, and T having the plunger base materials consisting of the palladium (Pd) alloy and having different coating layer materials, and the sample U having the plunger base material consisting of the beryllium copper (BeCu) alloy and having the coating layer consisting of three coating layers, i.e. the nickel (Ni), palladium (Pd), and ruthenium (Ru) layers.

As a result, it was confirmed that in the case of the samples Q, R, S, T, and U including the sample R having the tip part with the rhodium (Rh) coating layer, the sample S having the tip part with the ruthenium (Ru) coating layer, and the sample U having the tip part with the three coating layers, i.e. the nickel (Ni), palladium (Pd), and ruthenium (Ru) layers, wear did not occur at the tip parts. It was confirmed that in the case of the samples Q, R, S, and U, there was no tin (Sn), which was the solder component, at the tip parts. It was confirmed that when a platinum group layer 13 containing a platinum group element as a main component is formed as a coating layer, even during long-term conduction inspection on a solder material at high temperature, the tip part which comes into contact with the solder material is unlikely to abrade or wear, and tin (Sn) do not adhere thereto.

[Effects]

From the above-mentioned test results, it was confirmed that the plungers (the first plunger 10 and the second plunger 20) of the contact probe 1 of the present embodiment has a configuration in which abrasion and wear is unlikely to occur during conduction inspection. It is preferable to form the platinum group layer 13 with containing a platinum group element as a main component, and particularly, it is more preferable to form it with containing ruthenium (Ru) as a main component. Since the contact probe 1 is unlikely to abrade and wear during conduction inspection, in the case of using it in conduction inspection, the effort and cost for replacement work can be reduced. Further, from the test results of the sixth test, it was confirmed that the plunger of the contact probe 1 of the present embodiment has a configuration in which in the state where the tip part of the plunger is in contact with a solder material, tin (Sn) does not adhere to the tip part during conduction inspection and abrasion and wear is unlikely to occur. It is preferable to form the platinum group layer 13 with containing a platinum group element as a main component, and particularly, it is more preferable to form it with containing ruthenium (Ru) or rhodium (Rh) as a main component. Since the contact probe 1 has the plunger with the tip part which is unlikely to abrade and wear and to which tin (Sn) does not adhere during conduction inspection which is performed in the state where the tip part is in contact with a solder material, in the case of using it in conduction inspection, the effort and cost for replacement work can be reduced.

[Modifications]

By the way, it goes not without saying that embodiments to which the present invention can be applied are not limited to the above-described embodiment, and various modifications can be made without departing from the scope of the present invention.

In the above-described embodiment, as an example of the platinum group element which constitutes the platinum group layer 13, ruthenium (Ru), iridium (Ir), or rhodium (Rh) have been described in detail. However, instead of them, osmium (Os) may constitute the platinum group layer 13.

In the tip part of the first plunger 10 or the second plunger 20, on the outside of the platinum group layer 13, coating layers may be further formed of gold (Au), a gold (Au) alloy, palladium (Pd), or a palladium (Pd) alloy.

On the outside of the plunger base material 11, the platinum group layer 13 may be formed without forming the covering layer 12.

SUMMARY (GENERALIZATION)

Some embodiments and the modifications thereof have been described. These disclosures can be summarized as follow.

One aspect of this disclosure is a plunger including a conductive base layer and a platinum group layer which is provided on the outside of the base layer and contains a platinum group element as a main component.

According to this aspect, it is possible to implement a plunger including a platinum group layer containing a platinum group element as a main component on the outside a conductive base layer. Platinum group elements such as ruthenium (Ru), iridium (Ir), rhodium (Rh), and osmium (Os) have relatively high melting points higher than 2000° C., and are unlikely to melt due to conduction. For this reason, it is possible to make it difficult for abrasion and wear to occur during conduction inspection. Further, it is possible to implement a plunger such that in conduction inspection which is carried out in a state where the tip of the plunger is in contact with a solder material, it is difficult for the solder component to adhere to the tip part and it is difficult for abrasion and wear to occur.

A base material may be the base layer, and in a tip part to come into contact with an inspection object, the platinum group layer may be provided on the outside of the base layer.

In this case, it is possible to implement a plunger in which a tip part which comes into contact with inspection objects is unlikely to abrade.

A covering layer containing gold (Au) or palladium (Pd) as a main component may be provided on the outside of the base layer, and in the tip part, the platinum group layer may be provided on the outside of the covering layer.

In this case, it is possible to improve the adhesion between the base layer and the platinum group layer by the covering layer containing gold or palladium as a main component between the base layer and the platinum group layer.

The platinum group layer may be a surface layer.

In this case, it is possible to form the platinum group layer in the last step for manufacturing plungers, so for example, it is only required to add one step to the end of a plunger manufacturing process of the related art. Further, if a platinum group layer is used as a surface layer, it is possible to implement a plunger in which abrasion or wear is hardly occurred, as compared to the case where a platinum group layer is not used as a surface layer.

The platinum group layer may have a thickness of 0.02 μm or larger.

In this case, since the thickness of a platinum group layer is set to 0.02 μm or larger, it is possible to implement a plunger unlikely to abrade or wear even if it is used in conduction inspection.

The platinum group layer may contain iridium (Ir) as a main component.

In this case, it is possible to form a platinum group layer containing iridium (Ir) as a main component.

The platinum group layer may contain ruthenium (Ru) as a main component.

In this case, it is possible to form a platinum group layer containing ruthenium (Ru) as a main component. In the case of forming a platinum group layer containing ruthenium (Ru) as a main component, it is possible to implement a plunger in which abrasion or wear is hardly occurred, as compared to the case of forming a platinum group layer containing iridium (Ir) as a main component. Further, it is possible to implement a plunger such that in conduction inspection which is carried out in a state where the tip of the plunger is brought into contact with a solder material, the solder component is hardly adhered to the tip part and the abrasion and wear are hardly to be occurred.

The platinum group layer may contain rhodium (Rh) as a main component.

In this case, it is possible to form a platinum group layer containing rhodium (Rh) as a main component. Further, it is possible to implement a plunger such that in conduction inspection which is carried out in a state where the tip of the plunger is brought into contact with a solder material, the solder component is hardly adhered to the tip part and the abrasion and wear are hardly occurred.

The platinum group layer may contain osmium (Os) as a main component.

In this case, it is possible to form a platinum group layer containing osmium (Os) as a main component.

A contact probe may be configured to include any one of the above-mentioned plungers, and a spring that abuts on the plunger at an end part.

In this case, it is possible to implement a contact probe in which a plunger that comes into contact with inspection objects is hardly abraded or worn even if it is used in conduction inspection.

REFERENCE SIGNS LIST

1 CONTACT PROBE
10 FIRST PLUNGER
11 PLUNGER BASE MATERIAL
12 COVERING LAYER

13 PLATINUM GROUP LAYER
20 SECOND PLUNGER
30 SPRING
40 BARREL

The invention claimed is:

1. A plunger comprising:
   a conductive base layer entirely formed of a conductive material which is a palladium (Pd) alloy;
   a covering layer adhered to the base layer by implementing a surface treatment on the base layer, the covering layer being provided outside an entirety of the base layer, the covering layer containing palladium (Pd) as a main component, and the covering layer being a base plating layer that is a strike plating; and
   a platinum group layer adhered to the covering layer and provided outside an entirety of the covering layer, the platinum group layer containing a platinum group element as a main component, wherein
   the covering layer contains palladium as the main component to improve adhesion of the platinum group layer with the base layer during a conduction inspection in which current of 1 A or more is used,
   the base layer includes a conical part, and the conical part is formed of the conductive material which is the palladium alloy (Pd) at a tip part of the plunger which is configured to come into contact with an inspection object,
   the covering layer is provided all over an outside of the conical part and the tip part, and
   the platinum group layer is adhered to the covering layer with the covering layer provided all over the outside of the conical part of the base layer.

2. The plunger according to claim 1, wherein a base material is the base layer.

3. The plunger according to claim 2, wherein the platinum group layer is a surface layer.

4. The plunger according to claim 3, wherein the platinum group layer has a thickness of 0.02 μm.

5. The plunger according to claim 1, wherein the platinum group layer contains iridium (Ir) as a main component with a thickness of 0.5 μm.

6. The plunger according to claim 1, wherein the platinum group layer contains ruthenium (Ru) as a main component with a thickness of 1 μm.

7. The plunger according to claim 1, wherein the platinum group layer contains rhodium (Rh) as a main component.

8. The plunger according to claim 1, wherein the platinum group layer contains osmium (Os) as a main component.

9. A contact probe comprising:
   the plunger according to claim 1; and
   a spring that abuts on the plunger at an end part.

10. The plunger according to claim 1, wherein a shape of the tip part is a pyramid shape with a pointed end.

11. The plunger according to claim 1, wherein a shape of the tip part is a conical shape with a pointed end.

12. The plunger according to claim 1, wherein the surface treatment to adhere the covering layer to the base layer is performed by electroplating or hot-dip plating.

13. The plunger according to claim 1, wherein the conical part of the base layer has a rounded conical shape with a tip angle of 60 degrees.

14. The plunger according to claim 13, wherein a length of the conical shape of the tip part of the base layer is 0.452 mm.

15. The plunger according to claim 14, wherein the platinum group layer has a thickness of 0.02 μm.

16. The plunger according to claim 1, wherein the plunger includes a constricted part configured to be received in an annular wedge part of a barrel.

* * * * *